(12) United States Patent
Cooper et al.

(10) Patent No.: US 9,882,792 B1
(45) Date of Patent: Jan. 30, 2018

(54) FILTER COMPONENT TUNING METHOD

(71) Applicant: Nokia Solutions and Networks Oy, Espoo OT (FI)

(72) Inventors: Steven J. Cooper, Moorooka (AU); David R. Hendry, Auchenflower (AU)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 15/227,169

(22) Filed: Aug. 3, 2016

(51) Int. Cl.
*H04L 12/26* (2006.01)
*H04L 7/027* (2006.01)
*H04B 7/0456* (2017.01)

(52) U.S. Cl.
CPC ......... *H04L 43/028* (2013.01); *H04B 7/0456* (2013.01); *H04L 7/0276* (2013.01)

(58) Field of Classification Search
CPC ........... H03H 17/0248; H03H 17/0264; H03H 17/0283; H03H 17/0289; H03H 17/0291; H03H 17/0294; H03J 3/08; H03J 3/10; H03J 3/26; H03J 3/28; H04B 7/0456; H04L 7/0276; H04L 25/03019; H04L 25/03076; H04L 25/03114; H04L 43/028
USPC ........... 375/229, 232, 350; 455/178.1, 191.1, 455/340; 708/314, 322, 323
See application file for complete search history.

(56) References Cited

U.S. PATENT DOCUMENTS

| | | | |
|---|---|---|---|
| 6,313,722 B1 * | 11/2001 | Tsuzuki | H01P 1/20381 333/204 |
| 6,437,655 B1 | 8/2002 | Andoh et al. | |
| 2003/0016099 A1 | 1/2003 | Manseau et al. | |
| 2006/0176131 A1 * | 8/2006 | Junginger | H01P 7/06 333/227 |
| 2006/0202775 A1 | 9/2006 | Tsuzuki et al. | |
| 2016/0182065 A1 * | 6/2016 | Wicpalek | H03L 7/099 327/156 |

OTHER PUBLICATIONS

Clemente-Fernandez FJ et al.; "A new sensor-based self-configurable bandstop filter for reducing the energy leakage in industrial microwave ovens"; 2012; Meas.Sci, Technol. 23 (2012); whole document (14 pages).
Anonymous; "Quasi-Newton method"; Wikipedia, the free encyclopedia; 2015; whole document (4 pages).

(Continued)

*Primary Examiner* — Young T Tse
(74) *Attorney, Agent, or Firm* — Harrington & Smith

(57) ABSTRACT

Target mode frequencies are calculated for a defined filter component used as a reference for filter components to be tuned. The defined filter component has resonant mode(s), each having a mode frequency which can be tuned to a corresponding target mode frequency via physical adjustment of parameter(s) of the filter component. A tuning equation is formed by linearly relating, via a slope matrix, changes in the mode frequencies to corresponding physical adjustment in the parameter(s), and by using an inverse of the slope matrix as part of the tuning equation. A tuning procedure is performed for a filter component to be tuned, comprising: determining, using the tuning equation, adjustment information for parameter(s) of the filter component to adjust measured mode frequency(ies) of the filter component toward meeting corresponding target mode frequency(ies) for the resonant mode(s) within corresponding tolerance(s); and outputting the determined adjustment information for physical adjustment of the parameter(s).

27 Claims, 12 Drawing Sheets

(56) References Cited

OTHER PUBLICATIONS

Hirtenfelder. F.; "Filter Design and Tuning using CST Studio Suite"; 2012; CST—Computer Simulation Technology; whole document (40 pages).
Harscher, P. et al.; "Automated Filter Tuning Using Generalized Low-Pass Prototype Networks and Gradient-Based Parameter Extraction"; 2001; IEEE Transactions on Microwave Theory and Techniques, vol. 49, No. 12, Dec. 2001; pp. 2532-2538.
Gongal-Reddy, V. et al.; "Parallel Computational Approach to Gradient Based EM Optimization of Passive Microwave Circuits"; 2016; IEEE Transactions on Microwave Theory and Techniques, vol. 64, No. 1, Jan. 2016; pp. 44-59.

* cited by examiner

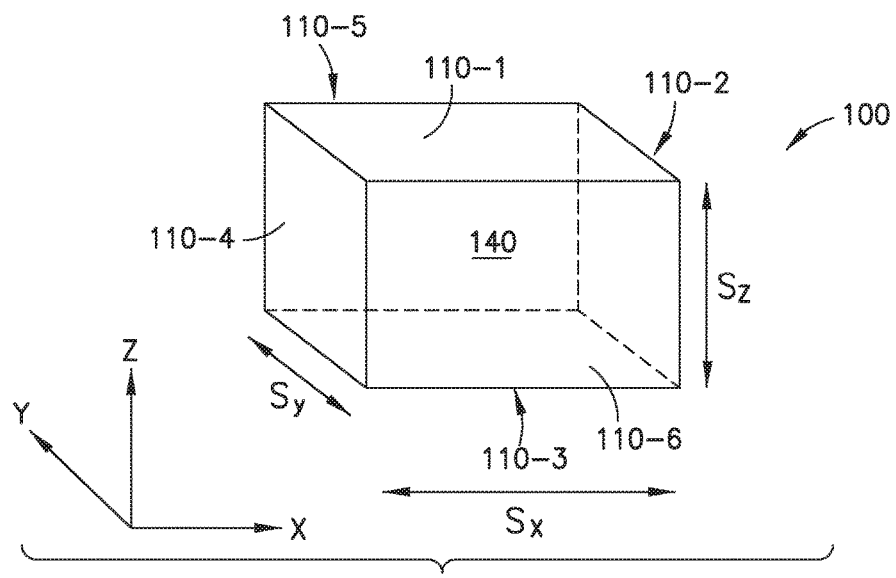
FIG.1
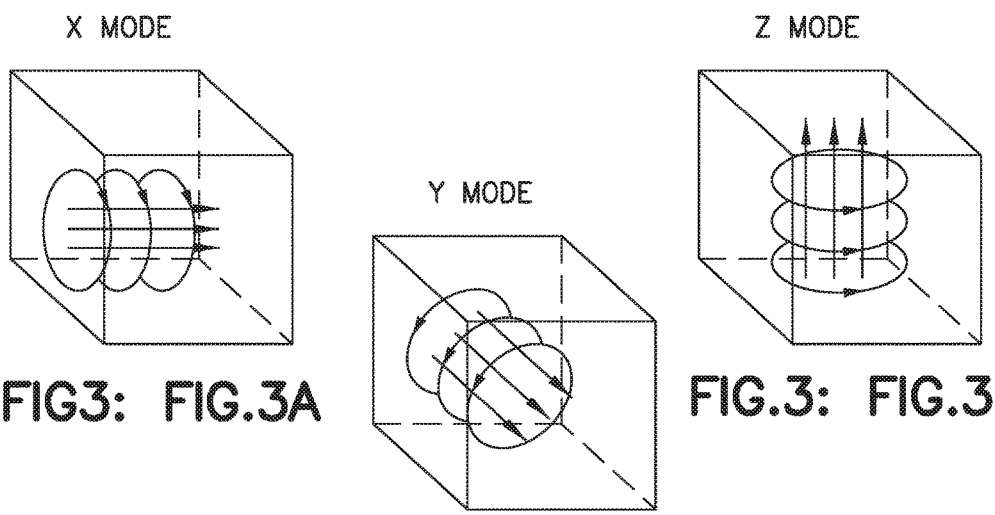
FIG.3: FIG.3A
FIG.3: FIG.3B
FIG.3: FIG.3C

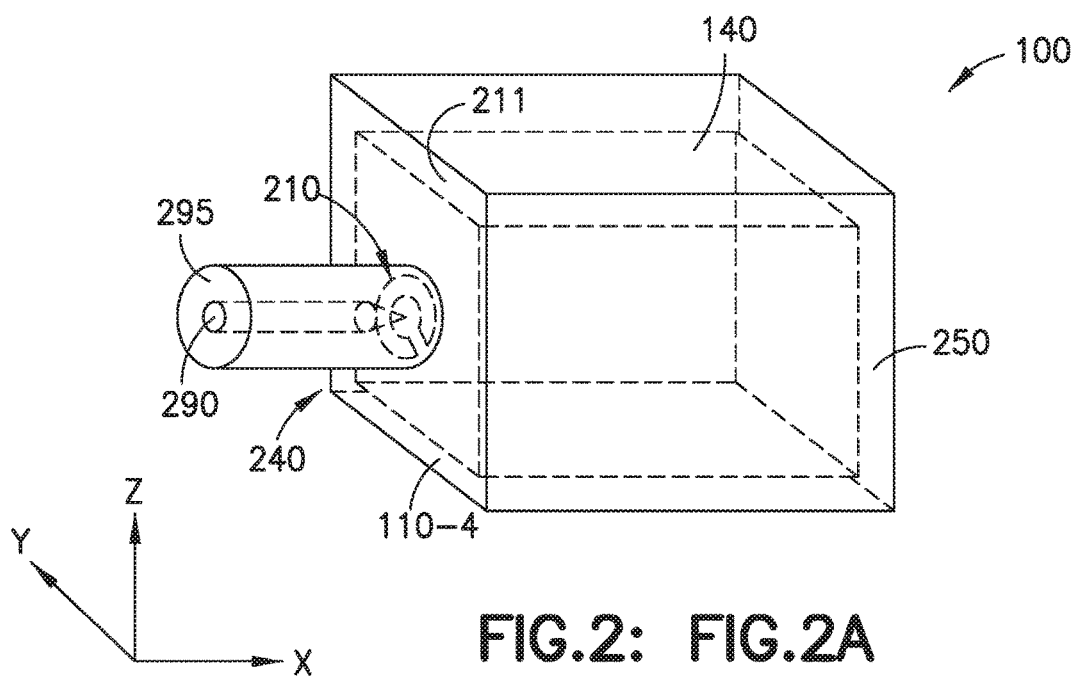
FIG.2: FIG.2A
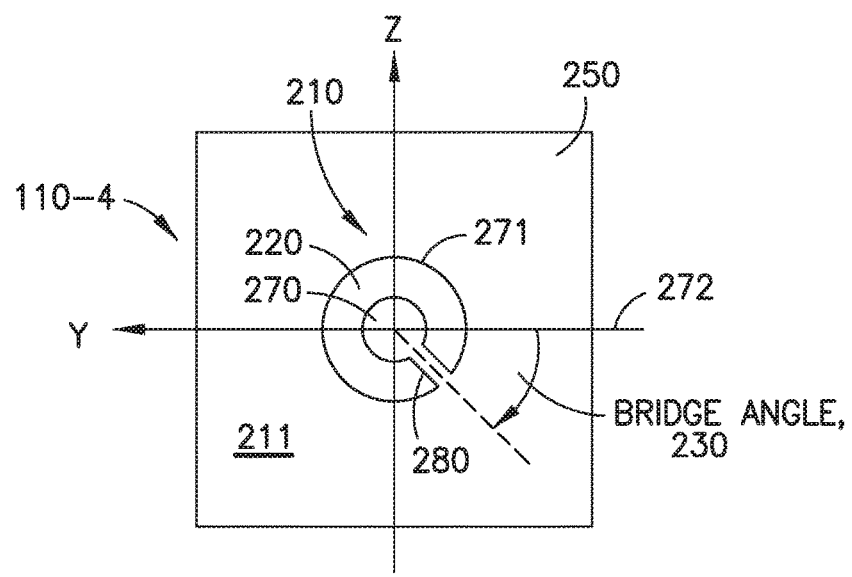
FIG.2: FIG.2B

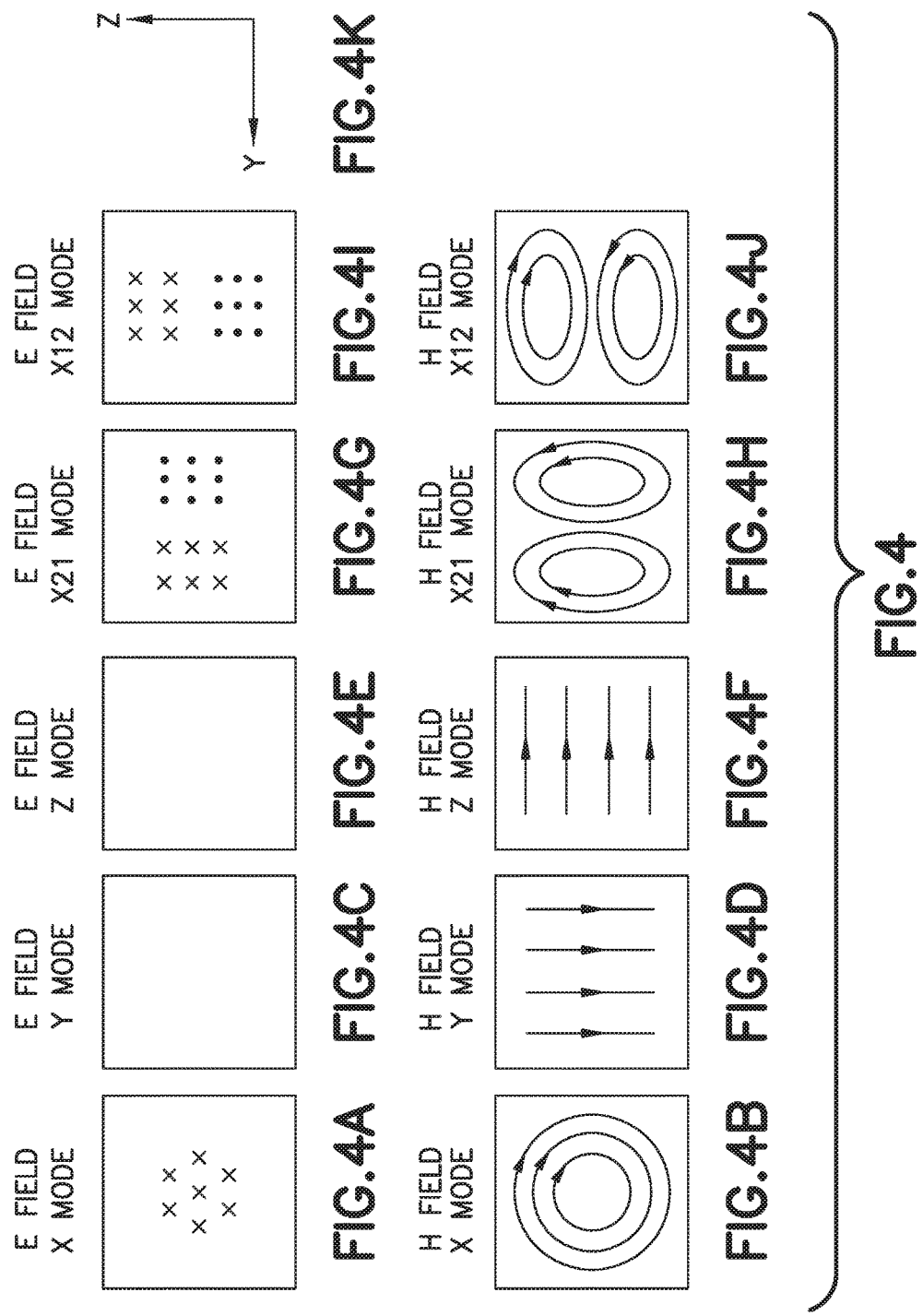

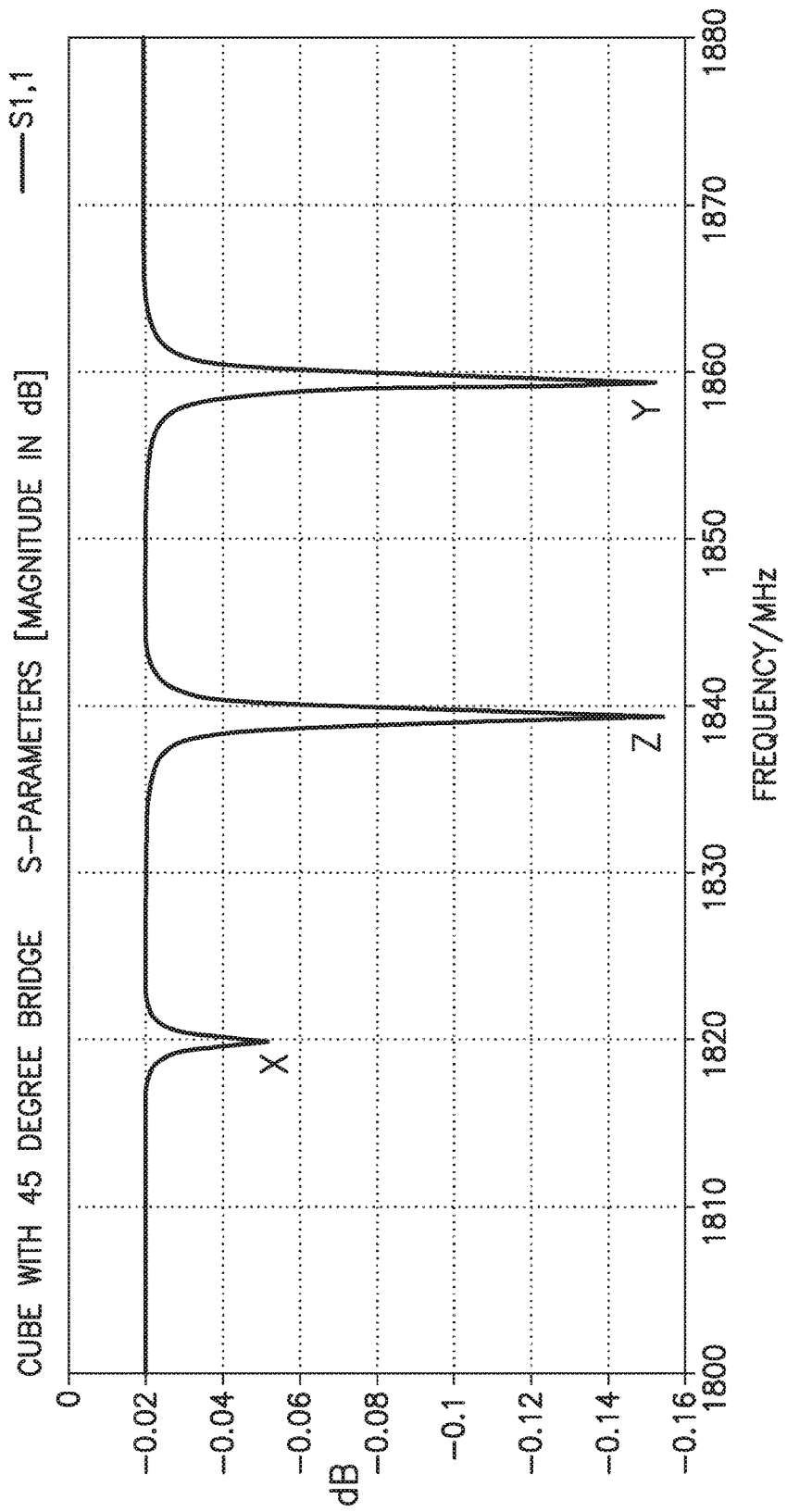
FIG 5: FIG. 5A

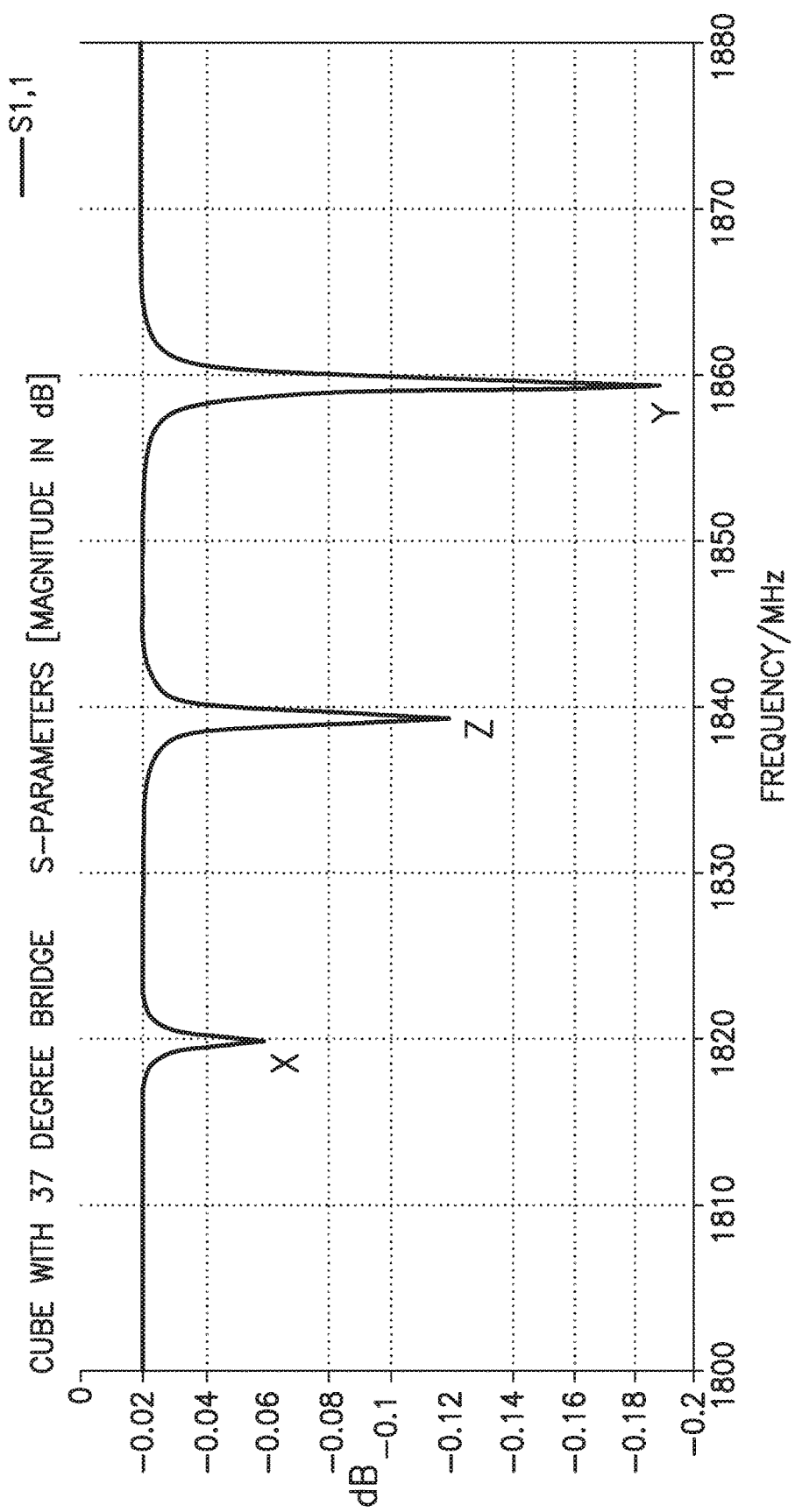

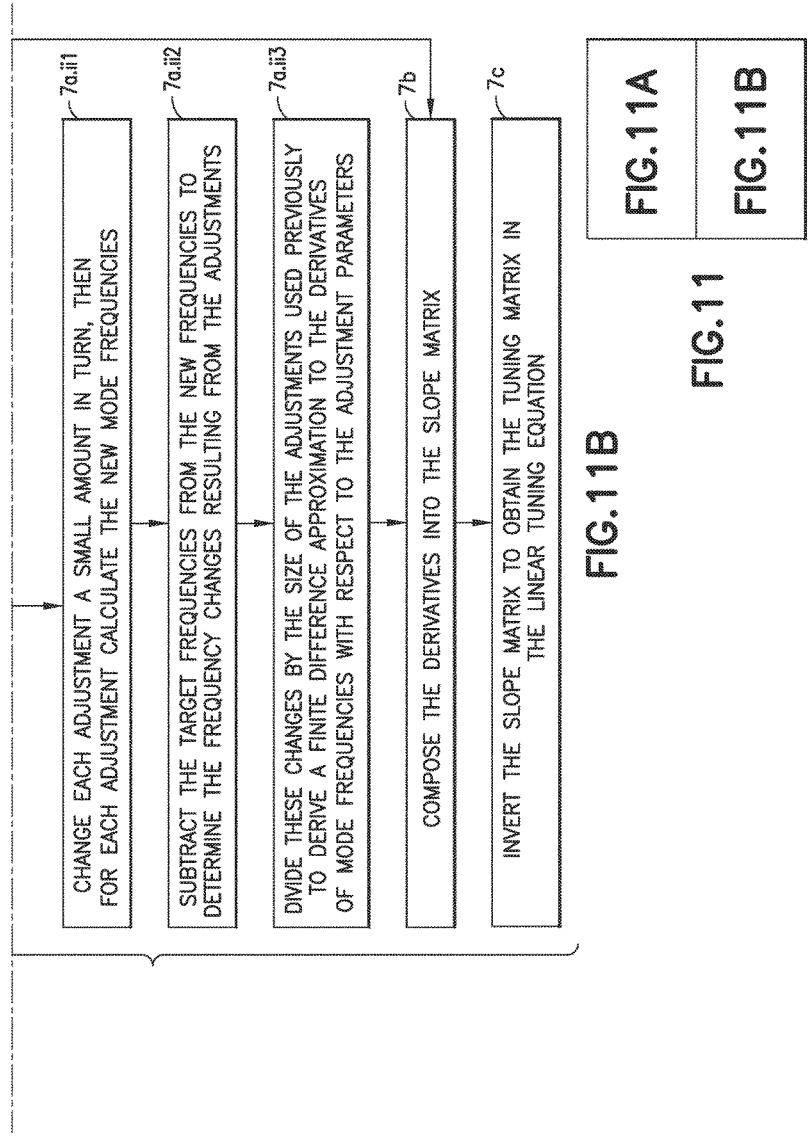

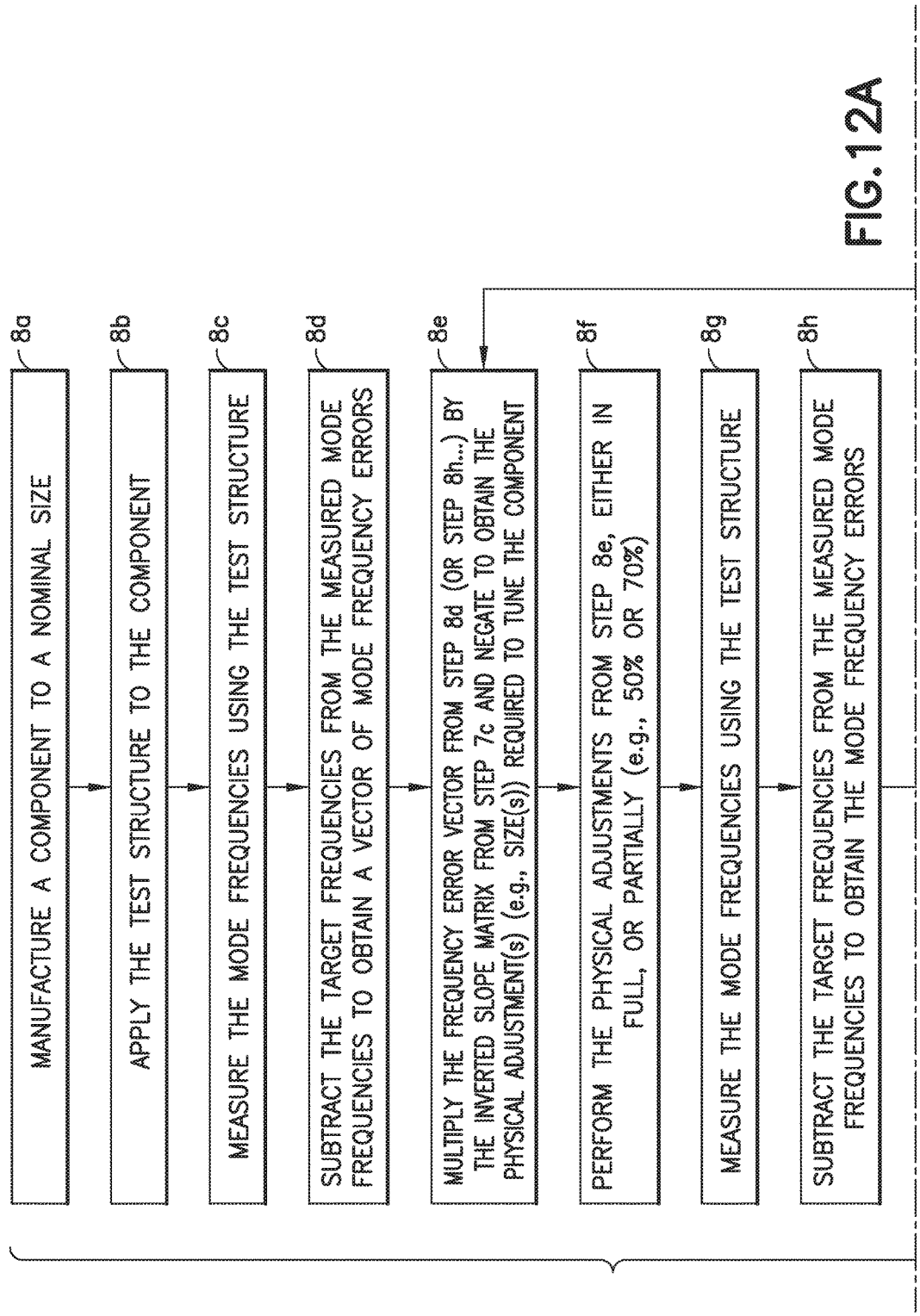

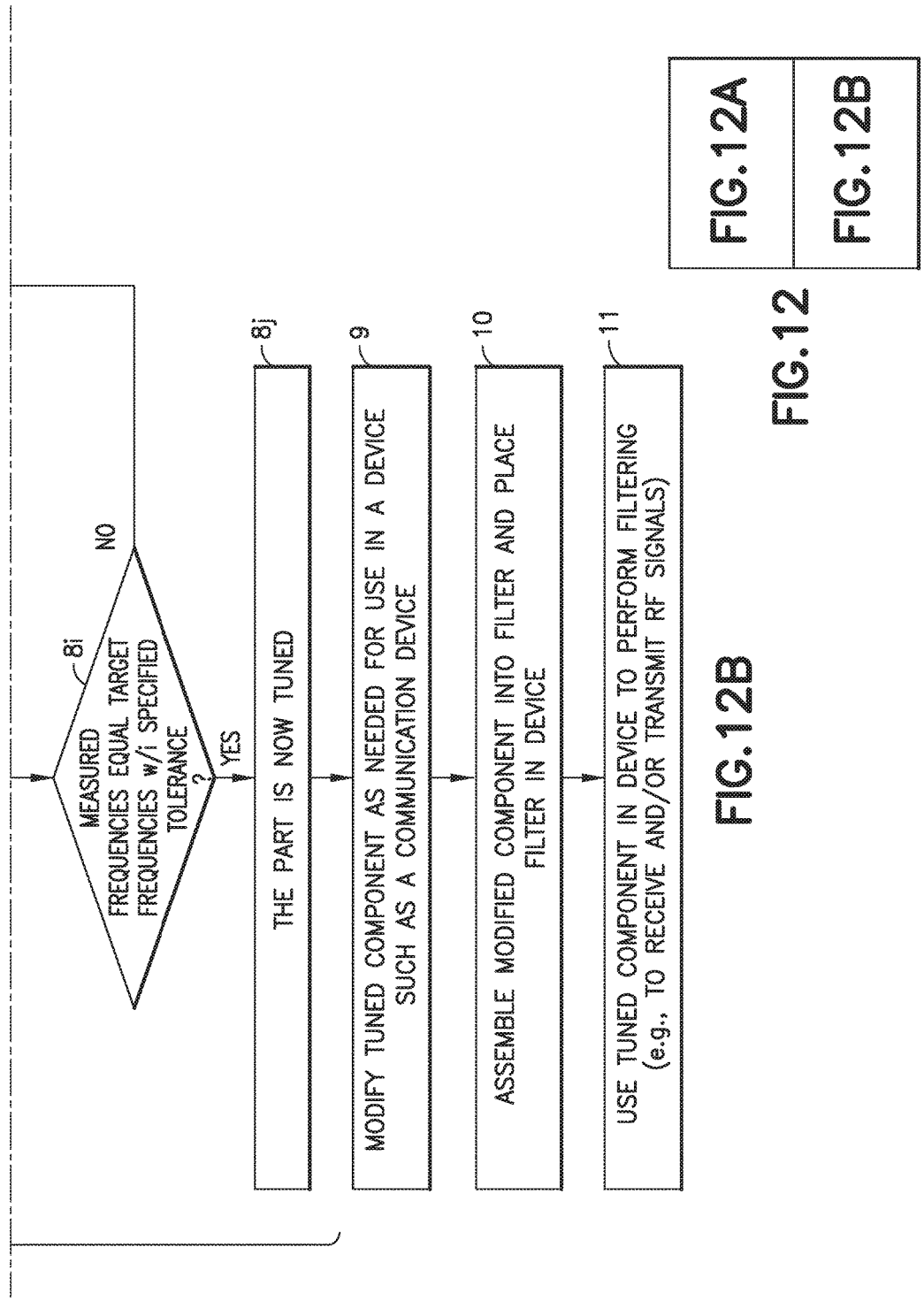

FILTER COMPONENT TUNING METHOD

TECHNICAL FIELD

This invention relates generally to filter components and, more specifically, relates to a method for tuning of the filter components.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

A filter is composed of a number of resonating structures and energy coupling structures which are arranged to exchange RF energy between themselves and the input and output ports. The pattern of interconnection of these resonators to one another and to the input/output ports, the strength of these interconnections and the resonant frequencies of the resonators determine the response of the filter.

During the design process for a filter, the arrangement of the parts, the materials from which the parts are made and the precise dimensions of the parts are determined such that an ideal filter so composed will perform the desired filtering function. If a physical filter conforming exactly to this design could be manufactured, then the resulting filter would perform exactly as intended by the designer.

However, in practice the precision and accuracy of manufacture of both the materials and the parts are limited, and this results in errors in resonant frequencies and coupling strengths which in turn cause the filter response to differ from that predicted by the ideal filter model. Often, this departure from the ideal response is sufficiently large to bring the filter outside of its acceptable specification. As a result, it is desirable to include in the filter design some means of adjusting the resonator frequencies and couplings to bring the filter response within the required specification.

A common way to accomplish this is to include tuning screws or other devices, such as are well known in the art. An alternative way often used in small ceramic monoblock filters is to remove selected portions of the metallization on the exterior of these filters, and possibly portions of ceramic as well, to accomplish the tuning.

Most filters are manufactured as completed units and the tuning process then performed on the entire filter. Since the many adjustments on the filter interact strongly with one another, the tuning procedure is often quite complicated, and requires a skilled operator.

An alternative tuning method is to build the separate resonator parts, tune them individually to a specification calculated for the separated parts from the ideal filter model, and then assemble them into the final filter. Since the individual parts are simple compared with the fully assembled filter, the tuning procedure for these individual parts can also be made very simple. This minimizes the need for skilled operators to tune the filters. This procedure also provides the benefit of either reducing or entirely eliminating the tuning process for the assembled filter.

In many cases it is sufficient to adjust only the resonant frequencies of the resonator parts because the manufacturing precision and accuracy are good enough to bring the coupling strengths within the required range to allow the assembled filter performance to be within specification. In such cases adjustment of the frequencies alone is all that is required to tune the individual parts.

To allow pretuning of the individual parts, both methods of measurement of the frequencies and methods of adjustment of the frequencies are required.

A tuning method may include the manipulation of a tuning device or structure included as part of the resonator, such as a tuning screw or deformable metal part. Alternatively, a method may comprise an operation performed on the resonator, such as the removal of material from a selected region. The method may also comprise a combination of these, or any other means or process which can alter the resonant frequencies of the resonator part.

A tuning physical adjustment (commonly abbreviated more simply as "adjustment") can then be defined as one or more manipulations of tuning structures and/or one or more operations causing one or more of the resonant frequencies to be altered. For instance, such physical adjustment includes but is not limited to removal of material from a surface/face, drilling of holes, adjustments of screws, and/or denting of material.

In cases where the parts include multimode resonators, the tuning methods for the parts will need to be able to independently adjust the resonant frequencies of the several modes of the resonator. For example, if the multimode resonator has three modes requiring independent adjustment, then at least three independent tuning adjustments will be required. It is a common situation with multimode resonators that an individual adjustment causes more than one of the mode frequencies to change. As a result, there is not a one-to-one correspondence between a single adjustment and a frequency change in a single mode.

What is needed to allow the multimode part to be easily tuned is a method to calculate the required adjustments to effect the desired changes in the set of mode frequencies.

SUMMARY

This section contains examples of possible implementations and is not meant to be limiting.

A method is disclosed in an exemplary embodiment. The method includes calculating one or more target mode frequencies for a defined filter component used as a reference for filter components to be subsequently tuned. The defined filter component has one or more resonant modes, each of which has a mode frequency which can be tuned to a corresponding target mode frequency via physical adjustment of one or more parameters associated with the filter component. The method includes forming a tuning equation at least by linearly relating, via a slope matrix, changes in the one or more mode frequencies to corresponding physical adjustment in the one or more parameters, and by using an inverse of the slope matrix as part of the tuning equation. The method includes, for a filter component to be tuned, performing a tuning procedure. The tuning procedure comprises: determining, using at least the tuning equation, adjustment information for at least one of the one or more parameters of the filter component to adjust each of one or more measured mode frequencies of the filter component toward meeting a corresponding target mode frequency for a corresponding resonant mode within a corresponding tolerance; and outputting the determined adjustment information for the at least one parameter to be used for physical adjustment of the at least one parameter.

In another example, another method is disclosed. This method comprises performing a tuning procedure using a tuning equation. The tuning equation has been previously formed and linearly relates, via a slope matrix, changes in one or more mode frequencies for a defined filter component to corresponding physical adjustment in one or more parameters of the defined filter component. Each of one or more resonant modes of the filter component can be tuned to a corresponding target mode frequency via physical adjustment of the one or more parameters. Performing the tuning procedure comprises: physically adjusting at least one of the one or more parameters of a filter component to be tuned until a tuned version of the filter component to be tuned has each of a set of the one or more measured mode frequencies meeting a corresponding target frequency for a corresponding resonant mode within a corresponding tolerance.

BRIEF DESCRIPTION OF THE DRAWINGS

In the attached Drawing Figures:

FIG. 1 is an example of a filter component, e.g., used for the methods of FIGS. 11 and 12 and described throughout;

FIG. 2, which includes both FIGS. 2A and 2B, illustrates the filter component of FIG. 1 with a test structure and transmission line attached, where FIG. 2A illustrates the test structure attached to a face of the filter component and the transmission line connected to the test structure, and where FIG. 2B illustrates the face of the filter component on which the test structure is attached;

FIG. 3, which includes FIGS. 3A, 3B, and 3C illustrates electric and magnetic fields of the X (FIG. 3A) modes, Y (FIG. 3B) modes, and Z (FIG. 3C) modes, for a cuboidal resonator;

FIG. 4 includes FIGS. 4A-4K, FIGS. 4A, 4C, 4E, 4G, and 4I indicate electric (E) fields for the X mode, Y mode, Z mode, X21 mode and X12 mode, respectively, FIGS. 4B, 4D, 4F, 4H, and 4J indicate magnetic (H) fields for the X mode, Y mode, Z mode, X21 mode and X12 mode, respectively, and FIG. 4K illustrates the planar orientation for FIGS. 4A-4J;

FIG. 5, which includes FIGS. 5A and 5B, illustrates S-parameters (in dB versus frequency) for cubes with a 45 degree bridge (FIG. 5A) and a 37 degree bridge (FIG. 5B);

FIG. 11, which includes FIGS. 11A and 11B, illustrates a process for forming a tuning equation in accordance with an exemplary embodiment;

FIG. 12, which includes both FIGS. 12A and 12B, illustrates a process for performing a tuning procedure in accordance with an exemplary embodiment.

DETAILED DESCRIPTION OF THE DRAWINGS

Figure 6:
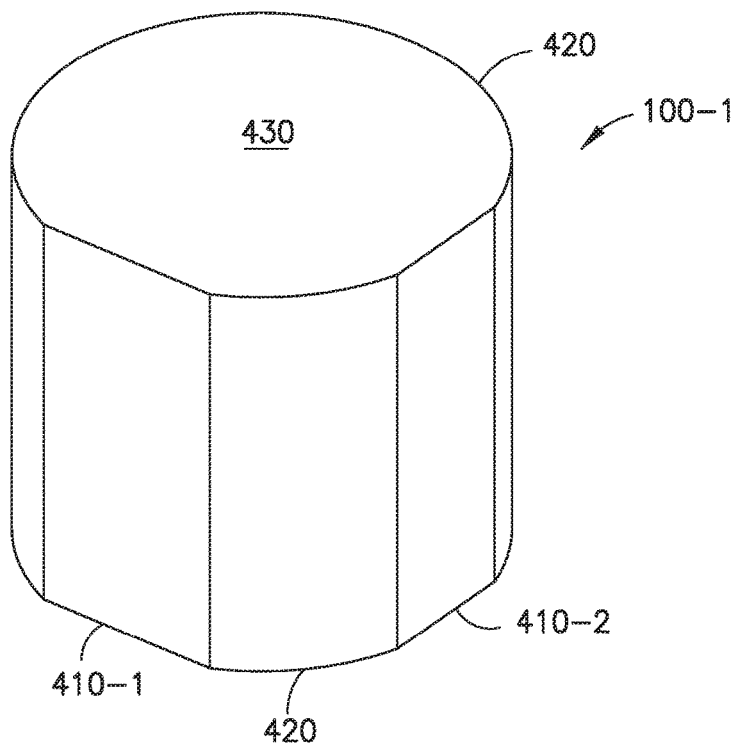
FIG. 6 illustrates a cylindrical resonator with regions removed.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As described above in part, what is needed to perform tuning operations on individual separated resonant components of a filter is the ability to calculate the desired target frequencies of the separated components, to measure the actual resonant frequencies of the components, and then to perform physical adjustments on the components to bring their actual frequencies into agreement with the target frequencies. Once this is done to the precision and accuracy required for a filter assembled from these tuned components to have a response within specification, the component is considered tuned.

Further, if the one or more of the above components is a multimode resonator, then at least as many independent physical adjustments are required as there are resonant mode frequencies to be adjusted. The typical situation with such multimode resonators is that each individual physical adjustment alters more than one of the mode frequencies, so that there is not a one-to-one correspondence between an individual physical adjustment and an individual mode frequency change. Consequently, if the multimode component is to be conveniently tuned, some means of calculating the set of physical adjustments which will effect a desired set of changes in the mode frequencies is required. Such a means is provided by the instant invention which will be described below.

In the absence of the techniques presented herein, and in the case where the physical adjustments are performed by means of a series of tuning screws or other similar devices whose actions are reversible, then the fact that one physical adjustment typically alters more than one mode frequency is not too troublesome because a skilled operator can perform combinations of adjustments to move particular frequencies in desired directions, and make additional corrective actions in the forward and reverse directions until the desired frequency shifts have been accomplished. However, if the operator were in possession of the techniques presented herein, then the required number of actions could be minimized, thus saving valuable time while tuning. Further, the skill level required of the operator would be reduced.

In the absence of the techniques presented herein, and in the case where the physical adjustments are not reversible, such as for example a drilling or lapping operation or the denting of a metal enclosure, then the fact that one physical adjustment typically alters more than one mode frequency is quite troublesome because even a skilled operator will need to perform much smaller steps to avoid overshooting the desired target frequencies. The procedure will be one of making many small adjustments to gradually approach the correct result for all of the modes. In the event of the physical adjustments overshooting the target, the part will need to be scrapped, or re-worked. Thus, in this situation the absence of these techniques greatly increases the time for tuning and the amount of wastage, thus making the production process much more expensive.

By contrast, the instant exemplary embodiments allow this process to be easier to control and more predictive. An overview of the process will now be presented, and then more detailed examples will be presented.

As discussed above, the full tuning process described herein requires a filter design which can be split into individual resonator components, where these components are configured to allow the resonant frequencies to be measured, where the desired resonant frequencies can be calculated and where methods to adjust the frequencies of the resonant modes are available. It also requires a method to calculate the required set of physical adjustments which will bring all of the mode frequencies into agreement with the calculated frequency targets. Each of these aspects will now be described. For ease of reference, this disclosure is divided into sections.

Section 1: Measurement and Introduction to a Filter Component

In order to measure the resonant frequencies of the multimode resonator, it is necessary to affix some kind of measurement device which couples to all of the resonator modes. Such a device needs to be so positioned as to be exposed to portions of the electric and/or magnetic fields of all of the modes of interest in the resonator. The design of the device needs to be such as to permit an exchange of energy with the resonator modes via the abovementioned electric and magnetic fields.

An example of a filter component that will be used in some of the techniques presented below is a cuboid, as illustrated in FIG. 1. The cuboid component 100 (also called a resonator) includes a dielectric cuboid 140 that has six sides: a top side 110-1, a right side 110-2, a bottom side 110-3, a left side 110-4, a back side 110-5, and a front side 110-6. Each individual side 110 is also considered to be a face of the component 100. The sides 110 are typically covered with conductive material (see FIG. 2A). The X, Y, and Z axes are shown, as are the corresponding dimensions Sx, Sy, and Sz. These axes are used throughout the figures. It is noted that the cuboid is used merely for ease of exposition, and other components 100 may be used, as is illustrated below.

An example of a measurement structure 210 is shown in FIG. 2, and will be referred to as a keyhole. FIG. 2 includes both FIGS. 2A and 2B, and illustrates the filter component of FIG. 1 with a keyhole 210 attached. FIG. 2A illustrates the test structure 210 attached to a face 110-4 of the filter component and illustrates a transmission line connected to the test structure 210. FIG. 2B illustrates the face 110-4 of the filter component 100 on which the test structure 210 is attached. The face 110-4 has a surface 211. The filter component 100 has a conductive coating 250 that covers a dielectric cuboid 140. This measurement structure 210 is formed in part as a region 220 devoid of metallization in an otherwise continuous coating 250 on the exterior of a ceramic resonator component 100. The measurement structure 210 comprises also a central conductive island 270 with a short conductive bridge 280 connecting the island 270 to the surrounding grounded perimeter 271 (of the coating 250). The center conductor 290 of an external coaxial or similar transmission line 240 is connected to the island 270 of the keyhole 210 and the shield 295 of the transmission line 240 is connected to the grounded perimeter 271 of the keyhole 210. The island 270 couples to any electric field striking the inside surface of the conductive coating 250 in the location of the keyhole structure, while the bridge 280 couples to any magnetic field running parallel to the surface 211 and at any angle not parallel to the bridge 280, also at the location of the keyhole 210. Such a measurement structure 210 will exchange energy with any resonant modes which conform to the above field distributions, and so will permit the frequencies of those modes to be determined by connecting the above transmission line to a vector network analyzer (VNA) or similar instrument.

Consider the case where the multimode resonator is a ceramic block formed into a cuboid shape and covered with a conducting layer such as silver (see FIG. 1). The three lowest order modes of such a resonator will frequently be employed as the active in-band modes of the filter, so only those modes will be considered here. These have electric fields running in three orthogonal directions which are parallel to each axis of the cube, and have magnetic fields circulating around the main axis of the electric field of each mode, as illustrated in FIG. 3. The modes with electric field lines running parallel to the X, Y and Z axes are referred to as the X (FIG. 3A), Y (FIG. 3B) and Z (FIG. 3C) modes, respectively.

The field distribution of most relevance to a measurement structure set into the conductive coating of the multimode resonator, such as the above keyhole, is that which occurs at the boundary between the ceramic and the inside surface of the conductive coating on the face on which the measurement structure is located. For this example, consider the situation where the measurement structure has been placed upon one of the X faces. FIG. 4 shows the electric and magnetic fields existing at the boundary between the ceramic and the conductive coating of the X face. The electric field of the X mode strikes the inside of the conductive coating perpendicularly, reaching a maximum at the center of the face and dropping to zero at the edges. This is indicated by the group of small crosses in the center of FIG. 4A. The corresponding magnetic field circulates around the face, having a maximum strength at the edge, and dropping to zero in the center, as shown in FIG. 4B. The Y and Z modes illustrated in FIGS. 4C-F have zero electric field over the entire face (see FIGS. 4C and 4E), while the corresponding magnetic fields are parallel to the Z and Y axes (see FIGS. 4D and 4F), respectively. Examples of additional higher order modes are shown in FIGS. 4G-4J. FIG. 4K illustrates the planar orientation for FIGS. 4A-4J.

If a keyhole is placed in the center of the X face, then the electric field of the X mode will couple to the keyhole island, and if the bridge is oriented at a non-perpendicular angle to both the Y and Z directions, for example 45 degrees, then the magnetic fields of both the Y and the Z modes will couple to the bridge. As a result, the keyhole will couple to all three of the modes of interest, therefore permitting their resonant frequencies to be measured. Examination of the magnetic fields of the additional modes shown in FIGS. 4H and 4J shows that the keyhole will also couple to both of these. This illustrates that the important aspect of the mode fields for determining whether significant coupling takes place is whether there is significant electric field striking the island and whether there is significant magnetic field not parallel to the bridge.

An example of such a measured signal is shown in FIG. 5A. FIG. 5 includes FIGS. 5A and 5B, and illustrates S-parameters (in dB versus frequency) for cubes with a 45 degree bridge (FIG. 5A) and a 37 degree bridge (FIG. 5B). The lowest frequency dip is the X mode, the next dip is the Z mode and the highest frequency dip is the Y mode. Note that the depths of the dips are not the same. By changing the angle 230 of the bridge 280 relative to the Y axis 272 in FIG. 2, the relative heights of the Y mode and Z mode dips can be varied, with approximate equality occurring at 45 degrees, as seen in FIG. 5A. The X mode dip is smaller than the other two. If the measurement structure 210 is placed in the center of the one of the faces of the cuboid resonator 100, and the angle of the bridge 280 is set to about 37 degrees to the Y axis 272, rather than the more obvious and symmetrical 45 degrees, then the amplitudes of the dips form a sequence in the order X smallest, Z intermediate and Y largest, which can assist in the identification of the dips during a frequency measurement. This signal is illustrated in FIG. 5B.

The use of a carefully chosen bridge angle 230 to provide identification of the modes corresponding to each dip provides a particular advantage in situations where the multimode resonator 100 has two or more mode frequencies which are sufficiently close that they may overlap or even cross during the tuning process. In such a situation, the ability to unambiguously identify the modes based only on the dip amplitudes avoids the need for auxiliary mode identification procedures, such as provision of an additional measurement structure elsewhere on the resonator.

Section 2: Physical Adjustment

A variety of physical adjustment methods are possible, such as removing ceramic material, drilling holes, inserting tuning screws and deforming a metal enclosure. A set of such methods may be employed to allow multiple mode frequencies to be altered. The essential feature is that the set of methods must provide a sufficient number of independent adjustments to allow the resonant frequencies of all of the desired modes to be altered. Each physical adjustment may comprise one or more individual actions, such as adjusting a tuning screw, drilling a hole or lapping material from a surface.

In order to implement the techniques presented herein, it is necessary that there be the same number of adjustments as mode frequencies requiring adjustment. Each adjustment can be composite, comprising a number of separate manipulations or operations, but the number of independent composite adjustments must equal the number of modes. It is also necessary that the adjustments be quantified so that the amount or size or extent of the adjustments can be specified by a mathematical procedure. For example, consider the case of a cuboid resonator where the three lowest order modes are to be adjusted, and where the adjustments to be employed are uniform removal of material from three orthogonal faces. Useful quantifications in this case are the three side lengths of the cuboid, or the amounts of material removed from each of the faces, or the change in size of the three side lengths. As another example, consider a cylindrical resonator where the three lowest order modes are to be adjusted. One adjustment could be uniform removal of material from one of the flat faces, quantified by the height of the cylinder. The second adjustment could be the drilling of two holes of equal depth oppositely located on the curved surface, and quantified by the hole's depth. The third adjustment could be another pair of equal depth holes located on the curved surface but orthogonally located relative to the first pair of holes, and quantified by the depth of the holes.

One convenient method for adjusting the resonant frequencies of a silvered ceramic resonator is to remove the silver from several regions to expose the ceramic, remove specified amounts of the ceramic from each exposed region, then resilver the regions. Each of these sequences of activities on a particular region constitutes an individual adjustment action (as described above), where the action may be quantified by the depth of ceramic removed, or alternatively by the change in the corresponding dimension of the part. We will refer to this as the lapping method. If the regions are comparable in size with a side of the resonator, then this method has the advantage that it minimally disturbs the geometry of the resonator and so largely preserves the distribution of electric and magnetic fields of the modes of interest.

Figure 7:
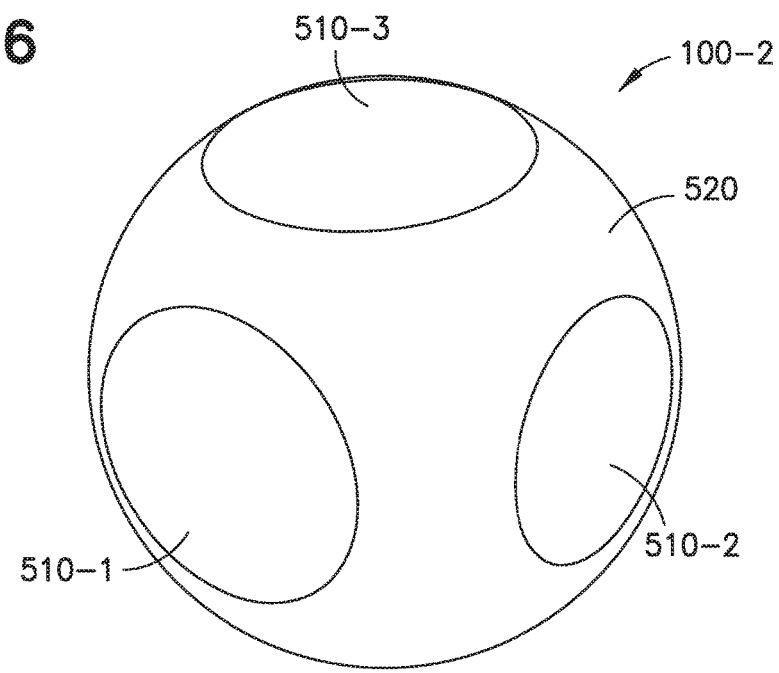
FIG. 7 illustrates a spherical resonator with regions removed.

This method is very well adapted to a cuboid resonator, where the abovementioned regions are three orthogonal faces, such as illustrated in FIG. 1. However, it also may be applied to other shapes, such as a cylindrical resonator, where one region is the flat top, and the other two regions are removed from the curved surfaces such that the resulting regions form three substantially perpendicular flattened areas. This is illustrated in FIG. 6, which shows a cylindrical resonator 100-1. The flat top 430 is shown, as is the outer curved surface 420 of the cylinder resonator 100-1. Two regions 410-1 and 410-2 are removed from the curved surface 420. A similar set of adjustment actions can be performed on a sphere, as illustrated in FIG. 7. FIG. 7 illustrates a spherical resonator 100-2 with an outside surface 520 and three regions 510-1, 510-2, and 510-3 removed from the outside surface 520. The adjustment information quantifying the adjustments might then be the amounts of material removed from each of the three substantially orthogonal regions.

A set of adjustment actions which are suitable for adjusting the resonant frequencies of a bare ceramic block located in a conductive enclosure is similar to that described above, except that because there is no silver coating, the ceramic can be removed directly. The removal of ceramic from a particular region constitutes an individual adjustment. We will refer to this as the direct lapping method. The locations and manner of ceramic removal for the examples of cuboidal, cylindrical and spherical blocks are the same as for the silvered case above. Of course, the blocks may need to be removed from the enclosure to perform the adjustment and then replaced afterward.

Yet another alternative set of adjustments which are applicable to both a silver coated ceramic resonator and a ceramic block located in a conductive enclosure is to drill holes of specified diameters and depths into the ceramic in selected locations. The drilling of an individual hole, or the further drilling of an already existing hole constitutes an individual adjustment. A convenient quantification of the adjustment action is the increase in hole depth. We will refer to this as the drilling method. This is a fast operation, but has the disadvantage of disturbing the electric and magnetic field distributions of the resonant modes to a significantly greater degree than occurs with the either of the lapping methods described above.

Figure 8:
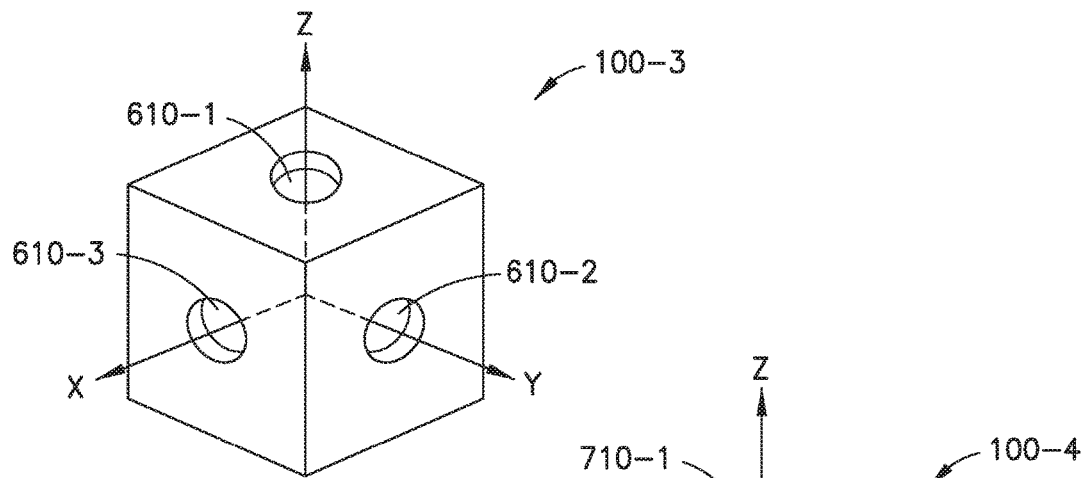
FIGS. 8, 9, and 10 illustrate possible adjustment hole locations for a cuboid, sphere, and cylinder, respectively.
Figure 9:
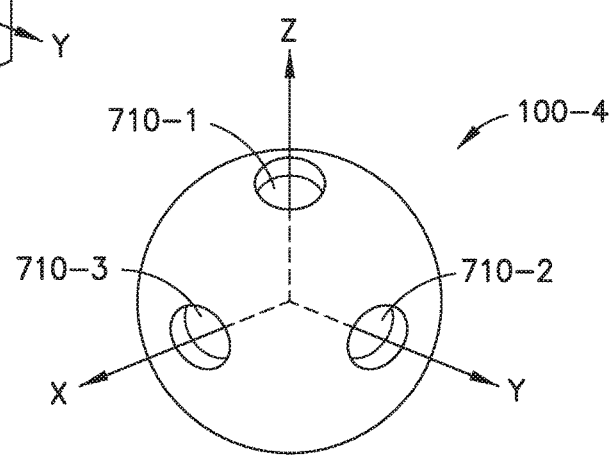
Figure 10:
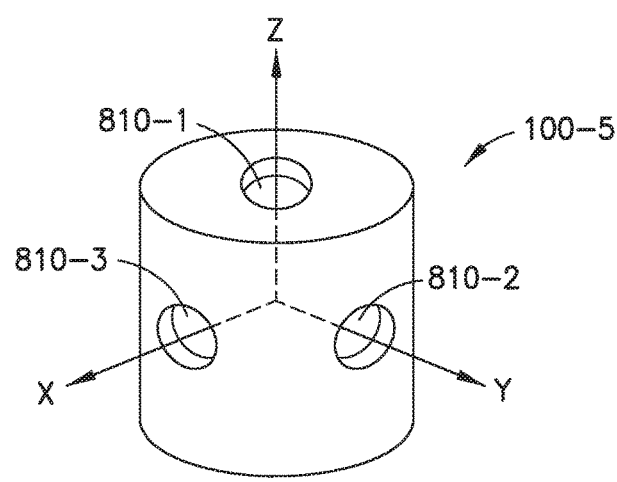

In the case of a cuboid block used as a triple mode resonator, a convenient set of adjustment hole locations are in the centers of each of three mutually orthogonal faces, such as illustrated in FIG. 8, which shows a cuboid resonator 100-3 with three adjustment holes 610-1, 610-1, and 610-3. A convenient set in the case of a spherical block is to use three holes 710 positioned such that the three radius lines between the center of the sphere and each of the three holes form a mutually orthogonal set, such as illustrated in FIG. 9. FIG. 9 illustrates a spherical resonator 100-4 with three adjustment holes 710-1, 710-1, and 710-3. In the case of a cylindrical block, convenient locations for the holes are one in the center of the top face, and two more holes halfway up the curved side separated by about 90 degrees from one another, as illustrated in FIG. 10. FIG. 10 illustrates a cylindrical resonator 100-5 with three adjustment holes 810-1, 810-1, and 810-3.

Section 3: Calculation

For small adjustments of a multimode resonator component, the mode frequencies will vary by a small amount so that the relationship between the adjustments and the frequencies will be approximately linear. By arranging the multiple adjustments as a vector of adjustable parameters, and the multiple frequency changes as another vector, the relation between them can be expressed as a simple matrix equation, where the matrix represents the slope (i.e., derivative) of frequency change versus adjustment parameter. The parameters correspond to physical structure such as the following: surface or face measurements; whether holes exist and if the holes exist what size (e.g., diameter plus depth) they are; whether screws are used and if so their configuration (e.g., diameter, depth of hole, how far screw goes into hole, material of screw, physical structure of end of screw); whether a structure is or is not dented and if dented to what degree. This is a non-exclusive and non-limiting list, and there could be multiple parameters per a component.

As an example, consider a resonator with three resonant modes and three adjustments. Let the resonant (e.g., mode) frequencies be denoted by the vector:

$$F = \begin{bmatrix} f_1 \\ f_2 \\ f_3 \end{bmatrix},$$

and the adjustments be quantified by the vector:

$$S = \begin{bmatrix} s_1 \\ s_2 \\ s_3 \end{bmatrix}.$$

The variation of frequencies with small adjustments can then be expressed by:

$$\Delta F = M \Delta S,$$

where the vector of adjustment changes is denoted by:

$$\Delta S = \begin{bmatrix} \Delta s_1 \\ \Delta s_2 \\ \Delta s_3 \end{bmatrix},$$

the vector of resultant frequency changes is denoted by:

$$\Delta F = \begin{bmatrix} \Delta f_1 \\ \Delta f_2 \\ \Delta f_3 \end{bmatrix},$$

and the slope matrix composed of partial derivatives of mode frequencies with respect to adjustment parameters is denoted by:

$$M = \begin{bmatrix} \frac{\partial f_1}{\partial s_1} & \frac{\partial f_1}{\partial s_2} & \frac{\partial f_1}{\partial s_3} \\ \frac{\partial f_2}{\partial s_1} & \frac{\partial f_2}{\partial s_2} & \frac{\partial f_2}{\partial s_3} \\ \frac{\partial f_3}{\partial s_1} & \frac{\partial f_3}{\partial s_2} & \frac{\partial f_3}{\partial s_3} \end{bmatrix}.$$

Similar equations describe resonators with different numbers of resonant modes and adjustments. All that changes is the number of elements in the vectors and slope matrix.

As a further example, consider a resonator with an arbitrary number of modes, with the actual number of modes denoted by N, and with the same number of adjustments. Let the resonant mode frequencies be denoted by the vector:

$$F = \begin{bmatrix} f_1 \\ f_3 \\ f_3 \\ \vdots \\ f_N \end{bmatrix},$$

and the adjustments be quantified by the vector:

$$S = \begin{bmatrix} s_1 \\ s_2 \\ s_3 \\ \vdots \\ s_N \end{bmatrix}.$$

The variation of frequencies with small adjustments can then be expressed by:

$$\Delta F = M \Delta S,$$

where the vector of adjustment changes is denoted by:

$$\Delta S = \begin{bmatrix} \Delta s_1 \\ \Delta s_2 \\ \vdots \\ \Delta s_3 \\ \Delta s_N \end{bmatrix},$$

the vector of resultant frequency changes is denoted by:

$$\Delta F = \begin{bmatrix} \Delta f_1 \\ \Delta f_2 \\ \Delta f_3 \\ \vdots \\ \Delta f_N \end{bmatrix},$$

and the slope matrix composed of partial derivatives of mode frequencies with respect to adjustment parameters is denoted by:

$$M = \begin{bmatrix} \frac{\partial f_1}{\partial s_1} & \frac{\partial f_1}{\partial s_2} & \frac{\partial f_1}{\partial s_3} & \cdots & \frac{\partial f_1}{\partial s_N} \\ \frac{\partial f_2}{\partial s_1} & \frac{\partial f_2}{\partial s_2} & \frac{\partial f_2}{\partial s_3} & \cdots & \frac{\partial f_2}{\partial s_N} \\ \frac{\partial f_3}{\partial s_1} & \frac{\partial f_3}{\partial s_2} & \frac{\partial f_3}{\partial s_3} & \cdots & \frac{\partial f_3}{\partial s_N} \\ \vdots & \vdots & \vdots & \ddots & \vdots \\ \frac{\partial f_N}{\partial s_1} & \frac{\partial f_N}{\partial s_2} & \frac{\partial f_N}{\partial s_3} & \cdots & \frac{\partial f_N}{\partial s_N} \end{bmatrix}.$$

Consider a multimode resonator component in a state with mode frequencies denoted by the vector $F_0$, and corresponding adjustable parameters given by the vector $S_0$. If small changes are made to the adjustable parameters, changing them to $S_{new}=S_0+\Delta S$, then the frequencies will change by a small amount to $F_{new}=F_0+M\Delta S$, where M is the slope matrix discussed above. Other effects, such as manufacturing inaccuracies, can also alter the mode frequencies, and because we are assuming small effects here, the changes to the mode frequencies from various sources are additive. This means we can use the frequency change due to the adjustable parameters to cancel (or correct) the frequency errors due to manufacturing inaccuracies.

Consider a manufactured component with a vector of measured frequencies denoted by $F_m$, and a vector of ideal target frequencies calculated from the ideal filter model denoted by $F_t$. The vector of frequency errors is then given by $\Delta F_e = F_m - F_t$. Let the state of the adjustable parameters at the time of measurement be denoted by $S_m$. If small changes, $\Delta S_a = S_a - S_m$, are made to the adjustable parameters on this manufactured component then the adjusted frequencies will be approximately given by $F_a = F_m + M\Delta S_a$. To tune the component we want the new adjusted frequencies to equal the target frequencies, so that the above equation becomes $F_t = F_m + M\Delta S_a$. We can then rearrange this equation to obtain the change to the adjustable parameters required to effect this tuning operation:

$$\Delta S_a = -M^{-1}\Delta F_e.$$

If the multimode resonator is of a simple geometrical shape such that analytic equations are available for the mode frequencies, the derivatives of these frequencies versus the resonator dimensions may be calculated and used to build the slope matrix. Alternatively, a 3D (three dimensional) electromagnetic simulation software package may be used to calculate the frequencies, and the changes to these frequencies, for small adjustments. These changes may be used to calculate a finite difference approximation to the slope matrix.

The presence of a frequency measurement test structure on the multimode resonator slightly shifts the frequencies relative to a bare resonator structure. As a result, the target frequencies towards which the part is to be tuned should be calculated to take these shifts into account. This can be done by performing a full 3D electromagnetic calculation, or may be done by perturbation analysis if the resonator has analytic equations for the mode frequencies and the test structure is small.

The matrix calculated using the analytic equations and that calculated using a full 3D calculation will be very similar, and the tuning adjustments calculated on the basis of either matrix will be within the practically achievable tolerance. As a result, it is satisfactory to use the analytic tuning matrix if that is available, and so greatly speed up the calculation.

Several kinds of errors may occur in the tuning process—errors in the calculated matrix, errors in the frequency measurement, errors in the adjustment actually performed, and departures from true linearity between the adjustments and the resultant frequency changes. If the tuning operation is performed in a series of steps, small errors of the above type will not prevent a successful tuning operation, as long as the target frequencies have been accurately calculated.

Figure 11A:
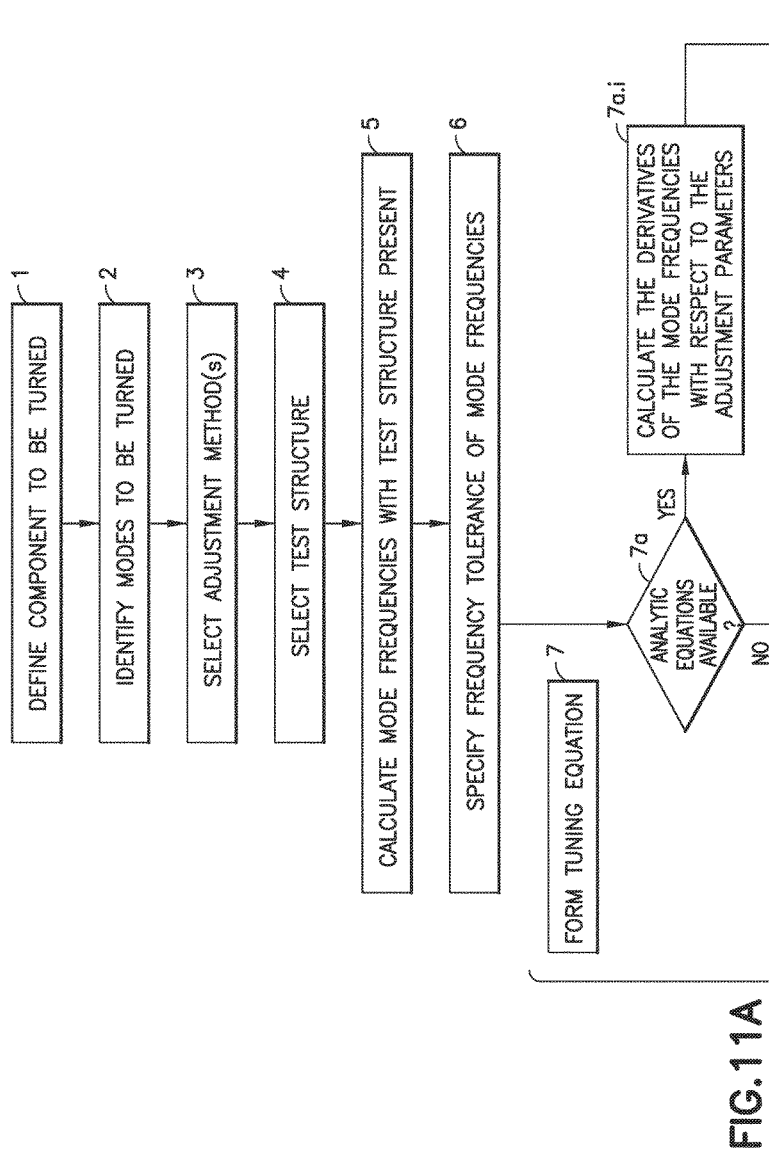

The exemplary embodiments are perhaps best illustrated through the use of a more detailed example, as presented in reference to FIGS. 11 and 12. FIG. 11, which includes both FIGS. 11A and 11B, illustrates a process for forming a tuning equation in accordance with an exemplary embodiment. FIG. 12, which includes both FIGS. 12A and 12B, illustrates a process for performing a tuning procedure in accordance with an exemplary embodiment. That is, FIG. 11 provides preparation for the tuning procedure that will be carried out in FIG. 12. Note that the methods in FIGS. 11 and 12 are typically used in a manufacturing process, where the filter components are manufactured to a nominal size, usually a little larger than the theoretical size to provide room to make the adjustments (e.g., one typically cannot add material, only take it away, in the examples of FIGS. 11 and 12 presented below). The adjustments made using the processes in FIGS. 11 and 12 then create a tuned filter component by physical adjustments of parameters of the component.

In step 1, a user defines a component to be tuned. The example that will be used is a cuboid, as illustrated in FIG. 1. The cuboid component 100 has six sides: a top side 110-1, a right side 110-2, a bottom side 110-3, a left side 110-4, a back side 110-5, and a front side 110-6. The X, Y, and Z axes are shown, as are the corresponding dimensions $S_x$, $S_y$, and $S_z$. For this example, these dimensions are employed as the quantified adjustments discussed earlier. These axes are used throughout the figures. It is noted that the cuboid is used merely for ease of exposition, and other components 100 may be used. See, e.g., FIGS. 6 and 7 as additional possible examples.

In step 2 of FIG. 11, a user identifies modes to be tuned. For instance, any one or more of the modes illustrated by FIG. 3A, 3B, or 3C may be identified. FIGS. 3A, 3B, and 3C represent electric and magnetic fields for modes along the X, Y, and Z directions, respectively, to be tuned.

Figure 13C:
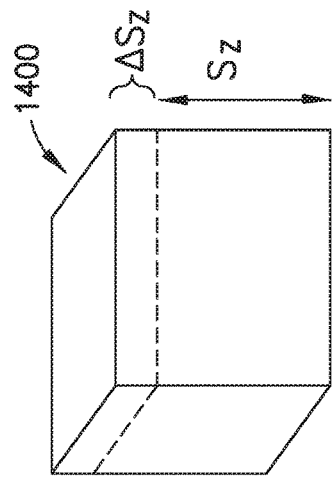
FIGS. 13A, 13B, and 13C represent possible physical adjustments in the X, Y, and Z directions, respectively, in the methods of FIGS. 11 and 12.
Figure 13B:
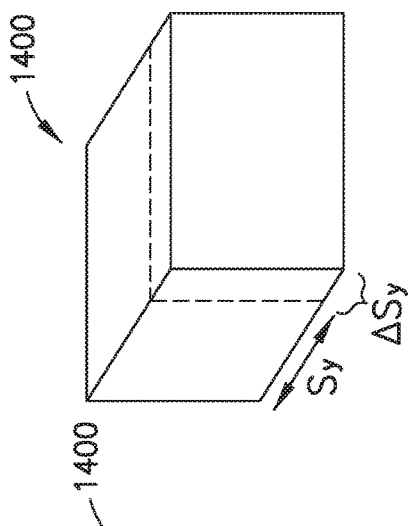
Figure 13A:
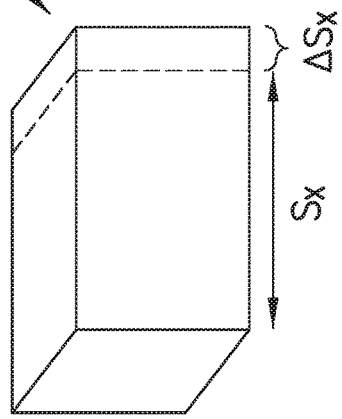
Figure 13D:
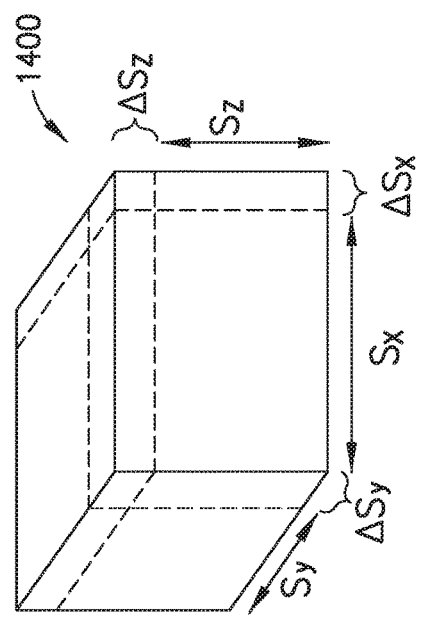
FIG. 13D shows multiple physical adjustments in the X, Y, and Z directions, in the methods of FIGS. 11 and 12.

For step 3, the user selects adjustment method(s). FIGS. 13A, 13B, and 13C represent possible adjustments in the X, Y, and Z directions, respectively, in the methods of FIGS. 11 and 12. Each cuboid component 1400 is a version of cuboid component 100, with one dimension elongated along one axis. FIG. 13A shows an adjustment, $\Delta S_x$, in the X direction for a cuboid component 1400. FIG. 13B shows an adjustment, $\Delta S_y$, in the Y direction for this cuboid component 1400, and FIG. 13C shows an adjustment, $\Delta S_z$, in the Z direction for this cuboid component 1400. One axis in each of FIGS. 13A, 13B and 13C is shown elongated to draw attention to the axis being adjusted. This does not imply that the adjustment must be carried out on the longest axis. The three diagrams are meant to represent three possible adjustments which might be performed on a single component. A single one or multiple ones of these adjustment methods may be selected. For instance, FIG. 13D illustrates adjustments (in X, Y, and Z directions) being performed on the same cuboid, and other combinations such as X and Y, X and Z, and Y and Z could be performed on the same cuboid.

The example for FIG. 11 assumes all three adjustment methods may be selected, but this is merely exemplary. In particular, if it is desired to independently adjust the resonant frequencies of interest in a multimode block, then at least the same number of adjustments as there are modes must be available, and further, these adjustments must be able to control all of the modes. Changes in the block adjustments lead to changes in the resonant frequencies of the block. For small changes, these are linearly related in a vector equation sense. For the cuboid block, the three lowest order modes are usually the ones of interest and the adjustments are variations in the three dimensions (X, Y, Z) of the block (though higher order modes may also be used). This is a good embodiment to use when it is desired to maintain the shape of the block to the ideal as closely as possible during the tuning process.

A similar process may be applied to blocks of other shapes; for example, a truncated sphere (a sphere with one or more regions removed from the surface of the sphere, such as illustrated in FIG. 7). Given that good methods exist for the fabrication of spheres (such as are used to manufacture ceramic ball bearings), it makes sense to remove material from the three regions (thereby causing "dips"). However, from an RF point of view, one could equally have extra material in the three regions (thereby causing "bumps"). Adjustments could then be made by removing material from the regions (whether they are dips or bumps). If the block is termed a truncated sphere then this implies the former. For all of these shapes, if the adjustments are chosen to give full control over all three modes, then for small adjustments the resultant frequency changes will be linearly related. This then allows the relation to be expressed as a vector multiplied by a matrix, as described below.

In step 4, the user selects a test structure and applies the test structure to the filter component. The test structure is capable of coupling to all three modes and so allowing their resonant frequencies to be measured. The test structure is also used below (e.g., in steps 8*b* and 8*c*). FIG. 2 illustrates the filter component 100 of FIG. 3 with a test structure attached. The filter component (e.g., cuboid component 100 with a conductive coating 250 that covers a dielectric cuboid 140) has a keyhole 210 in the coating 250 that covers the cuboid dielectric 140 and a probe (here, a transmission line 240). To change the dimensions of the cuboid (as done in FIG. 12), one possibility is to use fine sandpaper to remove the conductive coating (e.g., silver for this example) from three orthogonal faces, then use diamond abrasive to grind off the required amount of ceramic ($-\Delta S_x$, $-\Delta S_y$, and/or $-\Delta S_z$), and then re-apply silver to those three faces. Because material is being removed, the changes in the sizes, $S_x$, $S_y$, and $S_z$ will be negative. The faces are selected so that the measurement structure (e.g., comprising a keyhole) remains in place during this adjustment process.

For step 5, the user calculates mode frequencies of the filter component 100 with the test structure 210 present. These are the target frequencies. This calculation may be performed by using a 3D electromagnetic simulation software or via other techniques, although a human would set up the calculation (such as known in the art). These calculations are so complex that it will almost always be essential for a computer to be used. The target frequencies of the X, Y, and Z modes are denoted by $f_{tx}$, $f_{ty}$, and $f_{tz}$, respectively. These are to be used as the target frequencies for tuning the component.

In step 6, the user specifies frequency tolerances of mode frequencies (e.g., the permissible limits of variation in mode frequencies) which will be sufficient for the assembled filter containing the component to meet its performance specification. Typically, each mode frequency will have its own tolerance. The tolerances will be determined by performing a sensitivity analysis on the filter design. The details of this analysis are outside the scope of this disclosure. However, as a brief and non-limiting introduction, such an analysis typically involves changing the mode frequencies in the filter model by varying amounts from their nominal (e.g., design) values and then calculating the resulting filter performance. These changes simulate the effect of a filter with detuned resonator parts. The magnitudes of the mode frequency changes which cause the simulated filter to fail to meet its specification are then noted. The magnitudes of the differences between these altered mode frequencies and the nominal (e.g., design) frequencies then constitute the individual tolerances for each of the mode frequencies.

Step 7 calculates elements of a slope matrix and obtains a tuning equation, which will be subsequently used in FIG. 12. Step 7 has a number of sub-steps, described below. In general, the user linearly relates changes in mode frequencies to changes in adjustable parameters, using a slope matrix. That is, changes in mode frequencies are linearly related (e.g., for small changes) in adjustable parameters or features such as changes in cuboid dimensions. Strictly speaking, small changes give an approximate linear dependence, where the departure from linearity becomes less and less significant the smaller the changes become. Whether one can assume linearity depends on how large an error can be tolerated. If the cuboid is so badly mistuned that the tuning equation tells you to take off a lot of material, and if you attempt to take it all off in one step, then the error due to departure from strict linearity may cause you to take off too much material. If the tuning adjustment method is reversible (for example, tuning screws) this does not matter because you can fix the error in the next tuning cycle (e.g., steps 8*f*-8*i* of FIG. 12). However, if the tuning method is irreversible (for example, material removal) then overshooting means scrapping the component. To avoid this problem, it is safest to take less than the full amount of material off (such as in step 8*f* of FIG. 12).

More particularly, in a case where a particular physical tuning adjustment is reversible, a parameter of the component (to be tuned through physical adjustment) is made to a design dimension, which is the dimension specified by the theoretical filter model. In a case where a particular physical adjustment is not reversible, then this parameter of the component is made such that some amount of modification from a design dimension is required to reach the design size. That modification could be an increased amount of material (such as in a cuboid where the manufactured size along one axis is larger than the design dimension) or a different dimension (such as a drilled hole depth that has less depth than the design dimension).

Here is another example for a reversible tuning screw—the model will have a partially inserted screw (this is a design dimension for the screw). This is where FIG. 12 (e.g., see step 8*a*) starts when tuning a real component. A further example involves an irreversible drilling or lapping operation, where the component is made with extra material compared with design dimension(s), so a larger cube than nominal if lapping is the tuning operation, and a shallower hole than nominal if drilling is the tuning operation, and an un-dented metal enclosure if denting is the tuning operation.

In practice, it is possible to learn from experience how much extra to leave, based on a specific production line. If it was found that one was typically taking off up to 50 μm during the tuning operations, then the tuning process could start with the parts at least 50 μm oversize.

In the example here, the adjustable parameters are the dimensions of the cuboid, but other exemplary embodiments could use other parameters. In step 7, the user forms a tuning equation, e.g., based on the shape of the component. Consider the following equation:

$$\begin{bmatrix} \Delta f_x \\ \Delta f_y \\ \Delta f_z \end{bmatrix} = \begin{bmatrix} \frac{\partial f_x}{\partial S_x} & \frac{\partial f_x}{\partial S_y} & \frac{\partial f_x}{\partial S_z} \\ \frac{\partial f_y}{\partial S_x} & \frac{\partial f_y}{\partial S_y} & \frac{\partial f_y}{\partial S_z} \\ \frac{\partial f_z}{\partial S_x} & \frac{\partial f_z}{\partial S_y} & \frac{\partial f_z}{\partial S_z} \end{bmatrix} \begin{bmatrix} \Delta S_x \\ \Delta S_y \\ \Delta S_z \end{bmatrix}, \quad \text{Equation (1)}$$

which relates changes in mode frequencies $\Delta f$ (here, cuboid modes) to a slope matrix of partial derivatives and changes in adjustable parameters $\Delta S$ (here, cuboid sizes in three dimensions).

If analytic mode frequency equations are available to calculate the slope matrix step 7*a*=Yes), then in step 7*a*.i, the user calculates the derivatives of the mode frequencies with respect to the adjustment parameters. That is, it is possible that analytic equations are available for the filter component being tuned in the method of FIG. 11. If analytic equations are available, the equations may be used to determine the matrix elements and to obtain a tuning equation (see Equation (4a)) below. If the analytic mode frequency equations are available, the calculation of the tuning matrix can be performed using analytic equations (in which case a computer is probably used to calculate the results of the equations, although one could potentially use a calculator, or a slide rule, or a pencil). Alternatively, a computer calculation of the frequencies for several settings of the adjustable parameters is performed to allow an approximation to the slope matrix to be calculated. The inverse of this matrix would also likely be calculated using a computer, but well known methods exist for calculating matrix inverses by hand (although it is doubtful anyone would do so these days).

If no such analytic equations are available (or you do not want to do the math) (step 7*a*=No), then the user uses steps 7*a*.ii.1, 7*a*.ii.2, and 7*a*.ii.3 to numerically calculate the matrix. If analytic equations are not available, such as for a truncated sphere, one may use 3D electromagnetic simulations to calculate changes to mode frequencies and hence matrix elements for adjusted parameters.

In step 7*a*.ii.1, the user changes each (e.g., physical) adjustment a small amount in turn, then for each adjustment calculates the new mode frequencies. For instance, for the change $\Delta S_x$ illustrated in FIG. 13A, the user would calculate $f_{x,\Delta x}$, $f_{y,\Delta x}$, and $f_{z,\Delta x}$, where $\Delta x = \Delta S_x$ for ease of reference, and these are new mode frequencies based on the change from $S_x$ (the original size of the cube in the x direction) to $S_x + \Delta S_x$ (the final size of the cube in the x direction). Similar calculations would be made for the y and z directions if changed. For instance, for the change $\Delta S_y$ illustrated in FIG. 13B, the user would calculate $f_{x,\Delta y}$, $f_{y,\Delta y}$, and $f_{z,\Delta y}$, where $\Delta y = \Delta S_y$. Finally, for the change $\Delta S_z$ illustrated in FIG. 13C, the user would calculate $f_{x,\Delta z}$, $f_{y,\Delta z}$, and $f_{z,\Delta z}$, where $\Delta z = \Delta S_z$.

In step 7*a*.ii.2, the user subtracts the target frequencies from the new frequencies to determine the frequency changes resulting from the adjustments. Step 7*a*.ii.3 involves dividing these changes by the size of the adjustments used previously (e.g., in step 7*a*.ii.1) to derive a finite difference approximation to the derivatives of mode frequencies with respect to the adjustment parameters.

For instance, for small changes $\Delta S_x$, $\Delta S_y$, and $\Delta S_z$ (written as $\Delta x$, $\Delta y$, and $\Delta z$, respectively), the following equations will give a reasonable approximation to the matrix elements:

$$\frac{\partial f_x}{\partial S_x} \approx \frac{f_{x,\Delta x} - f_{x0}}{\Delta x},$$

$$\frac{\partial f_x}{\partial S_y} \approx \frac{f_{x,\Delta y} - f_{x0}}{\Delta y},$$

$$\frac{\partial f_x}{\partial S_z} \approx \frac{f_{x,\Delta z} - f_{x0}}{\Delta z},$$

$$\frac{\partial f_y}{\partial S_x} \approx \frac{f_{y,\Delta x} - f_{y0}}{\Delta x},$$

$$\frac{\partial f_y}{\partial S_y} \approx \frac{f_{y,\Delta y} - f_{y0}}{\Delta y},$$

$$\frac{\partial f_y}{\partial S_z} \approx \frac{f_{y,\Delta z} - f_{y0}}{\Delta z},$$

$$\frac{\partial f_z}{\partial S_x} \approx \frac{f_{z,\Delta x} - f_{z0}}{\Delta x},$$

-continued $$\frac{\partial f_z}{\partial S_y} \approx \frac{f_{z,\Delta y} - f_{z0}}{\Delta y},$$

and $$\frac{\partial f_z}{\partial S_z} \approx \frac{f_{z,\Delta z} - f_{z0}}{\Delta z}.$$

In step 7*b*, the user composes the derivatives into the slope matrix and, in step 7*c*, the user inverts the matrix to obtain the tuning matrix. For instance, assume Equation (1) is written as follows:

$$\begin{bmatrix} \Delta f_x \\ \Delta f_y \\ \Delta f_z \end{bmatrix} = M \begin{bmatrix} \Delta S_x \\ \Delta S_y \\ \Delta S_z \end{bmatrix}, \quad \text{Equation (2)}$$

where M is the slope matrix, Equation (2) can be rewritten as follows:

$$\begin{bmatrix} \Delta S_x \\ \Delta S_y \\ \Delta S_z \end{bmatrix} = M^{-1} \begin{bmatrix} \Delta f_x \\ \Delta f_y \\ \Delta f_z \end{bmatrix}, \quad \text{Equation (3)}$$

where $M^{-1}$ is the inverse of the slope matrix, M, and is also referred to as the tuning matrix. The $\Delta S_x$, $\Delta S_y$, and $\Delta S_z$ are changes in the adjustable parameters that are needed to produce the frequency changes $\Delta f_x$, $\Delta f_y$, and $\Delta f_z$.

The method in FIG. 11 provides preparation for the tuning that will be carried out in FIG. 12. Turning to FIG. 12, step 8 has a user performing part of a method for performing tuning. That tuning operation has a number of sub-steps.

In step 8, the user performs a tuning procedure. Steps 8*a*-8*j* are examples of one possible tuning procedure. In step 8*a*, the user manufactures a component to a nominal size. This nominal-sized component will be tuned in part of FIG. 12. In step 8*b*, the user applies the test structure to the component.

In step 8*c*, measurements are taken of the component mode frequencies, e.g., using the test structure 210 of FIG. 2. The measured component mode frequencies in this example are $f_{mx}$, $f_{my}$, and $f_{mz}$. The physical measurement of the frequencies could be done by a human, using an instrument (a VNA most likely). It is possible that an automated machine could be used to take the physical measurements.

The measured frequencies would then be fed into the tuning equation to calculate the required adjustments. This part could be done by hand, but in practice this would be performed using at least a calculator and most likely using a computer.

In step 8*d*, the user (e.g., using a computer) subtracts target frequencies from the measured mode frequencies to obtain a vector of mode frequency errors. It is assumed the user has previously calculated the target frequencies for the ideal component including the test structure (see step 5 of FIG. 11). The target frequencies are as follows: $f_{tx}$, $f_{ty}$, and $f_{tz}$. The target frequencies are those of a cuboid of the same size as the ideal component in the final filter, but without the coupling structures of the final filter. Instead, in an exemplary embodiment, the component is simply silvered all over and then the test structure put in place. The component as used in the final filter will have additional apertures or other structures formed into the silver coating. These will alter the resonant frequencies significantly compared with the simple silvered part with a measurement structure installed. Since we perform the adjustments directly from the silvered part with the measurement structure, all we care about is the frequencies of the ideal silvered part with the measurement structure. As described above, the presence of a tuning structure on the cuboid (in this example) slightly shifts the frequencies relative to a fully silvered cuboid. As a result, the target frequencies towards which the part is to be tuned should be calculated to take these shifts into account. This can be performed by performing a full 3D electromagnetic calculation, or may be performed by perturbation analysis if the cuboid has analytic equations for the mode frequencies and the test structure is small.

The mode frequency errors may be calculated as follows:

$$\Delta f_{ex} = f_{mx} - f_{tx},$$

$$\Delta f_{ey} = f_{my} - f_{ty}, \text{ and}$$

$$\Delta f_{ez} = f_{mz} - f_{tz}.$$

In step 8e, the user multiplies the inverted slope matrix from step 7c by the frequency error vector from step 8d (or step 8h if traversing the loop multiple times) and negates to obtain magnitudes of the adjustment actions (e.g., amounts of material removed) required to tune the component. The physical adjustment could be many things, such as an amount of material removed from a face of a cuboid or a truncated surface, or the adjustment could be drill hole depth, or tuning screw insertion depth, or many other possible parameters. That is, the user calculates the adjustments in the parameters (in this case, the dimensions ΔS) required to alter the mode frequencies by the amount from step 8d, and so correct the frequency errors. The (e.g., physical) adjustments required may be calculated by the following tuning equations:

$$\Delta S_a = -\Delta S = -M^{-1}\Delta F_e, \quad \text{Equation (4a)}$$

$$\Delta S_a = \begin{bmatrix} \Delta S_{ax} \\ \Delta S_{ay} \\ \Delta S_{az} \end{bmatrix}, \quad \text{Equation (4b)}$$

$$\Delta F_e = \begin{bmatrix} \Delta f_{ex} \\ \Delta f_{ey} \\ \Delta f_{ez} \end{bmatrix}, \quad \text{Equation (4c)}$$

where $\Delta F_e$ is the vector of frequency errors calculated earlier and $\Delta S_{ax}$, $\Delta S_{ay}$, and $\Delta S_{az}$ are changes in adjustable parameters needed to correct the frequency errors. In one example, these correspond to an amount of material that should be physically removed. In another example, these correspond to an amount that should be changed, e.g., by tuning screw(s) or denting. In step 8f, the user performs the required physical adjustments, either in full, or partially (e.g., 50% or 70%).

Small inaccuracies in the tuning matrix, $M^{-1}$, (which is the inverse of the slope matrix, M) may be rendered unimportant by performing only a fraction of the adjustments calculated in step 8e so that the loop 8e to 8i is traversed more than once. The user therefore, in step 8g, measures the mode frequencies using the test structure. Similar to step 8d, in step 8h, the user the user subtracts target frequencies from the measured mode frequencies to obtain the mode frequency errors.

In step 8i, it is determined if the measured frequencies are equal to the target frequencies within some specified tolerances. Since the mode frequency errors are just the difference between the measured (actual) and the desired (ideal, or targets) frequencies, if the mode frequency error magnitudes are less than the corresponding tolerances then this is equivalent to saying that the mode frequencies are equal to the target frequencies within the corresponding tolerances. If block 8i=No, then steps 8e to 8i are performed again.

More specifically, if the adjustments could go in both directions (such as by use of a tuning screw) then the user would perform the full adjustment in step 8f, and then correct any errors during the next loop through steps 8e through 8i. However, when one removes material from a face of the cube (say by lapping), one can only increase the frequencies. A user therefore needs to be careful not to overshoot. A good strategy to avoid this is to only make a fraction of the required change at step 8f, say 70% (percent). More than one trip around the 8e through 8i loop is then required, but the resulting tuning process is more robust against errors in measurements and inaccuracies in the tuning matrix. A further inaccuracy that this method mitigates is departures from true linearity of the frequency change versus the adjustment. For small changes, the frequency change is approximately linear, but as the changes get larger, the approximation gets worse. If a user tries to make the full step 8e adjustment in one step, the user may overshoot (or perhaps undershoot if the user is lucky).

If the measured frequencies are equal to the target frequencies within some specified tolerance (block 8i=Yes), then the output in step 8j is a filter component that has been tuned to a set of frequencies. In step 9, the tuned component is modified as needed for use in communication device. For instance, any hole in the silver coating for the measurement structure may be covered (e.g., with silver or other suitable conductive coating) and then other coupling structures are etched into the conductive coating to complete the component. The component is then ready to be assembled into a filter. In step 10, the modified component is assembled into a filter and the filter is placed in a communication device. In step 11, the modified, tuned component is used (as part of a filter) in a communication device to receive and/or transmit RF signals.

Although processes for creating a tuned component from a designed component have been described above, it is also possible to describe this as a logical sequence, described below. This logical sequence provides a simpler view of the sequence.

Concerning the "ideal size" below, this is just a useful concept to better understand the logic, but in reality it is not that important. Instead, in this tuning method, we tune the frequency (which is what matters in a filter) rather than being concerned about the exact size. This way, manufacturing variations in shape and dielectric constant are automatically compensated for in the tuning process without one needing to know what they are. Instead, one only needs to calculate the required adjustment (or size change), not the absolute size.

The logical sequence is as follows:
Frequency error=actual frequency−target frequency;
Size error=actual size−ideal size;
Frequency error=slope matrix*size error;
Size error=inverse slope matrix*frequency error;
Required adjustment=−size error; and Required adjustment=−inverse slope matrix*frequency error.

The slope matrix may be thought of as the derivative of frequency with respect to size (or more generally, with respect to the adjustment parameters).

It is noted that parts or all of the process in FIG. 11 and could in principle be performed using computers and automation. Typically, however, a human would perform some of the process, as described above.

The examples of FIGS. 11 and 12 concerned a cuboid. The techniques presented herein are not limited to a cuboid, however. For example, an alternative implementation is a cuboid as above, but the adjustments are small silvered or unsilvered holes drilled into three orthogonal faces. This is a useful implementation when it is desired that the adjustments make only a small impact on the block. Drilling adjustments make a small impact on the block in terms of overall size, but in terms of distortion of the geometry, they make a larger impact.

A similar process as in FIGS. 11 and 12 may be applied to blocks of other shapes. For example, and as described previously, the process may be applied to a truncated sphere (a sphere with one or more regions removed from the surface of the sphere), where the modes of interest are the three lowest order modes, and the adjustments are removal of material from three approximately orthogonally placed regions on the surface of the sphere. These might be planar regions, or curved regions. Adjustments could then be made by removing material from the regions (whether they are dips or bumps). If the block is termed a truncated sphere then this implies the former (dips).

As a further example, the process may be applied to a truncated cylinder where the height is chosen to make the three lowest order modes fall into the desired frequency region. As with the sphere above, the truncated cylinder could be adjusted by removing material from three approximately orthogonal regions.

Both sphere and cylinder could also be adjusted by three approximately orthogonally placed drill holes, either silvered or unsilvered.

Other shapes are also possible, for example, half spheres, cones, pyramids, donuts. For all of these shapes, if one needs to independently tune all three modes, then at least three adjustments are needed, as for the cuboid. If one only needs two modes adjusted (say the third mode is far away from the other two and away from the passband), then at least two adjustments are needed. If one needs more than three modes adjusted, then at least as many adjustments as there are modes to adjust are needed. For example, a four mode component will require at least four adjustments. It is possible to tune single mode slabs using a single adjustment on one face. The other two modes are not considered, or indeed any of the higher order modes (of which there are many). The matrix for the adjustments can be inverted so that the resulting tuning equation tells what adjustments are required to achieve a certain frequency change, and thus allows the tuning equation to be used to inform the tuning process on a multimode resonator component, as described above.

Section 4: Worked Example—Lapped Cuboid

As an illustration, consider a filter component consisting of a metallized ceramic cuboid. Let us suppose that the filter design calls for a cuboid of a dielectric constant and size such that the three near-degenerate resonant frequencies are 1820 MHz, 1840 MHz and 1860 MHz. Such a set of frequencies may be suitable for a filter for the downlink portion of the 1800 MHz mobile band.

Let us further suppose that the sizes are such that these three mode frequencies correspond to the X, Z and Y modes, respectively. If the dielectric constant of the ceramic is 45 (a common material available from multiple ceramic manufacturers), then the required size of the cuboid is 16.813 mm, 17.560 mm and 17.172 mm in the X, Y and Z dimensions, respectively.

When tuning a component using the method disclosed here, it is necessary for a measurement structure of some kind to be attached to the component to allow the frequencies of the modes to be determined. In the example here, the measurement structure and associated connecting probe introduced earlier is formed in the metallized coating on one of the X faces. The form and dimensions of this structure are shown in FIG. 2B. A 3D electromagnetic simulation of this component with attached measurement structure was performed to determine the mode frequencies in the presence of the measurement structure. For the case described above, the perturbed mode frequencies are now 1819.734 MHz, 1859.478 MHz, and 1839.486 MHz for the X, Y and Z modes, respectively. The above three mode frequencies will be used as the target frequencies for the subsequent tuning operations, and denoted by:

$$F_t = \begin{bmatrix} 1819.734 \\ 1859.478 \\ 1839.486 \end{bmatrix}_{MHz}.$$

In addition to the need for a measurement structure, the tuning method disclosed here also requires some kind of adjustment method or structure. In the case of a cuboid component such as in this example, a particularly convenient means to adjust the frequencies is to use the lapping method described earlier, and so that will be assumed for this example. Tuning actions for this method will be quantified by the changes (decreases) in the dimensions ($S_x$, $S_y$, and $S_z$, below), of the cuboid due to the material removed during lapping.

The analytic expressions for the mode frequencies of a cuboid made from a material with a uniform and isotropic dielectric constant of $e_r$, and with X, Y and Z sizes of $S_x$, $S_y$, and $S_z$, respectively, and where the speed of light is denoted by c are:

$$F_x = \frac{c}{2\sqrt{e_r}}\left(\frac{1}{S_y^2} + \frac{1}{S_z^2}\right),$$

$$F_y = \frac{c}{2\sqrt{e_r}}\left(\frac{1}{S_x^2} + \frac{1}{S_z^2}\right),$$

and $$F_z = \frac{c}{2\sqrt{e_r}}\left(\frac{1}{S_x^2} + \frac{1}{S_y^2}\right).$$

The partial derivatives required to form the slope matrix are then given by the following expressions:

$$\frac{\partial F_x}{\partial S_x} = 0,$$

$$\frac{\partial F_x}{\partial S_y} = -\frac{c^2}{4\sqrt{e_r}\, S_y^3 F_x},$$

-continued $$\frac{\partial F_x}{\partial S_z} = -\frac{c^2}{4\sqrt{e_r}\,S_z^3 F_x},$$

$$\frac{\partial F_y}{\partial S_x} = -\frac{c^2}{4\sqrt{e_r}\,S_x^3 F_y},$$

$$\frac{\partial F_y}{\partial S_y} = 0,$$

$$\frac{\partial F_y}{\partial S_z} = -\frac{c^2}{4\sqrt{e_r}\,S_z^3 F_y},$$

$$\frac{\partial F_z}{\partial S_x} = -\frac{c^2}{4\sqrt{e_r}\,S_x^3 F_z},$$

$$\frac{\partial F_z}{\partial S_y} = -\frac{c^2}{4\sqrt{e_r}\,S_y^3 F_z},$$

and $$\frac{\partial F_z}{\partial S_z} = 0.$$

The slope matrix may then be formed from the above expressions, as shown in Equation (1). Substituting the values for the cuboid example above, inverting the matrix and converting to units of μm/MHz yields the following inverse slope matrix, or tuning matrix:

$$M^{-1} = \begin{bmatrix} 8.66 & -8.85 & -8.76 \\ -9.87 & 10.09 & -9.98 \\ -9.23 & -9.43 & 9.33 \end{bmatrix}_{\mu M/MHz}.$$

This set of scaled units (size changes in μm and frequency changes in MHz) is convenient for practical work, although of course the matrix values may be scaled to allow any desired units to be employed.

This tuning matrix can also be calculated using the finite difference approximation discussed earlier. Even though one would not use such a method for a cuboid since the analytic equations are quite simple to use, it is instructive to do the calculation as an exercise to illustrate the accuracy of the method. Accordingly, the 3D electromagnetic simulation software used to calculate the frequency targets above was also used to calculate the mode frequencies under small changes in dimensions. The results are shown in the following table.

|  | Target Values | Vary Sx | Vary Sy | Vary Sz |
|---|---|---|---|---|
| Sx (mm) | 16.813 | 16.823 | 16.813 | 16.813 |
| Sy (mm) | 17.560 | 17.560 | 17.570 | 17.560 |
| Sz (mm) | 17.172 | 17.172 | 17.172 | 17.182 |
| ΔSx | 0 | 0.01 | 0 | 0 |
| ΔSy | 0 | 0 | 0.01 | 0 |
| ΔSz | 0 | 0 | 0 | 0.01 |
| Fx (MHz) | 1819.7344 | 1819.7385 | 1819.2296 | 1819.1948 |
| Fy (MHz) | 1859.4782 | 1858.9144 | 1859.4785 | 1858.9485 |
| Fz (MHz) | 1839.4857 | 1838.9164 | 1838.9841 | 1839.4846 |
| ΔFx | 0 | 0.0041 | −0.5048 | −0.5396 |
| ΔFy | 0 | −0.5638 | 0.0002 | −0.5298 |
| ΔFz | 0 | −0.5693 | −0.5016 | −0.0011 |
| ΔFx/ΔSx |  | 0.41 |  |  |
| ΔFx/ΔSy |  |  | −50.48 |  |
| ΔFx/ΔSz |  |  |  | −53.96 |
| ΔFy/ΔSx |  | −56.38 |  |  |
| ΔFy/ΔSy |  |  | 0.02 |  |
| ΔFy/ΔSz |  |  |  | −52.98 |
| ΔFz/ΔSx |  | −56.93 |  |  |
| ΔFz/ΔSy |  |  | −50.16 |  |
| ΔFz/ΔSz |  |  |  | −0.11 |

The resulting slope matrix in units of MHz/mm is thus:

$$M = \begin{bmatrix} 0.41 & -50.48 & -53.96 \\ -56.38 & 0.02 & -52.98 \\ -56.93 & -50.16 & -0.11 \end{bmatrix}_{MHz/mm}.$$

Inverting this and scaling to units of μm/MHz gives the tuning matrix calculated by the finite difference method:

$$M^{-1} = \begin{bmatrix} 8.69 & -8.84 & -8.75 \\ -9.85 & 10.05 & -10.02 \\ -9.26 & -9.47 & 9.31 \end{bmatrix}_{\mu M/MHz}.$$

Comparison between this tuning matrix and the analytically calculated one above shows that differences only occur in the second decimal place, with the maximum error being less than 0.5%. This demonstrates that when the perturbation due to the measurement structure is small, the error resulting from the use of the analytic equations to calculate the slope matrix is also small. However, the differences between the resonant frequencies of the unmodified cuboid (1820, 1860 and 1840 MHz for the X, Y and Z modes) and the cuboid with attached keyhole measurement structure (1819.734, 1859.478 and 1839.486 MHz for the X, Y and Z modes) are large enough to be significant for the tuning of a filter, so even though the analytic equations can be used to calculate the slope matrix, they should not be used to calculate the target frequencies. These should be calculated using a 3D electromagnetic simulation.

To further extend the example, let us suppose that a component has been manufactured, and due to manufacturing variations in size and dielectric constant the measured frequencies of the X, Y and Z modes are 1816, 1855 and 1837 Mhz, respectively. These measure frequencies are denoted by:

$$F_t = \begin{bmatrix} 1816.000 \\ 1855.000 \\ 1837.000 \end{bmatrix}_{MHz}.$$

The target frequencies calculated above are subtracted from these measured frequencies to yield the following frequency errors:

$$\Delta F_e = F_m - F_t = \begin{bmatrix} -3.734 \\ -4.478 \\ -2.486 \end{bmatrix}_{MHz}.$$

By performing a matrix multiplication of this frequency error vector by the tuning matrix calculated above we obtain the vector of size changes relative to the design sizes corresponding to these frequency errors. To obtain the required size change to the actual resonator to correct this frequency error we negate the above to obtain the following expression for the required size correction:

$$\Delta S_a = -M^{-1}\Delta F_e = \begin{bmatrix} -28.9 \\ -16.7 \\ -100.1 \end{bmatrix}_{\mu m}.$$

Thus, in this example the X, Y and Z sizes of the cuboid resonator need to be reduced by 29, 17 and 100 um, respectively. This would be achieved by performing the lapping process (described earlier) on each of the X, Y and Z faces in turn, removing the amounts of material given above. Assuming that errors in the 3D electromagnetic model, the calculated matrix, the measurement and the lapping adjustment are not too large then the above operation should have brought all three of the resonant frequencies of the cuboid into agreement with the frequency targets, $F_t$. The part would then be tuned.

If the combined errors are too large then it may be prudent to remove only a fraction of the amounts calculated above, and then repeat the cycle of measurement, calculation and adjustment until the part is tuned. As discussed above, this is to avoid the errors causing too much material to be removed and so scrapping the part.

Section 5: Worked Example—Lapped Cylinder

As a further illustration, consider a filter component consisting of a metallized ceramic cylinder with four truncated regions on the curved sides located 90 degrees apart, such as illustrated in FIG. 6. Let this resonator have a dielectric constant of 45, a diameter of 19.173 mm, a height of 18.646 mm, two planar truncations of depth 0.924 mm on two opposing sides of the curved region (and denoted as the X truncations), two planar truncations of depth 0.5 mm on two opposing sides of the curved region at right angles to the above X truncations (and denoted as the Y truncations). Let the cylinder also have a keyhole measurement structure of the form and dimensions shown in FIG. 2B be formed in the flat region 430 at the top of the cylinder.

Since no analytic equations are available for the resonant frequencies of a truncated cylinder, the slope matrix must be calculated using the finite difference method. Accordingly, the resonant frequencies were calculated using a 3D electromagnetic simulation, both with the dimensions of the cylinder and the truncations at the design sizes given above, and also with small changes to allow the slope matrix to be calculated. The resulting target frequencies are 1819.669 MHz for the mode with the electric field running parallel to the X direction (perpendicular to the X truncation planes), 1859.612 MHz for the mode with the electric field running parallel to the Y direction (perpendicular to the Y truncation planes), and 1839.905 MHz for the mode with electric field running in the Z direction (perpendicular to the planar end faces). These target frequencies are denoted by:

$$F_t = \begin{bmatrix} 1819.669 \\ 1859.612 \\ 1839.905 \end{bmatrix}_{MHz}.$$

The adjustment method assumed in this example is the lapping method, where the tuning actions for this will be quantified by the depth of ceramic material lapped off one of the two X truncations, the depth lapped off one of the two Y truncations, and the height of the cylinder in the Z direction. These are denoted by $U_x$, $U_y$, and $U_z$, respectively. The symbol U is used here instead of the symbol S to avoid confusion with size. In the cuboid case, the size of the cube is physically being adjusted. Meanwhile, in the cylinder case, only the size of the cylinder in the Z direction might be modified, and in the X and Y directions, the lapping removes small portions of the surface, which do not really affect the "size" of the cylinder (as other locations not truncated would have the same diameter).

Since there are no analytic equations for the resonant frequencies of a truncated cylinder, the tuning matrix must be calculated using the finite difference approximation discussed earlier. Accordingly, the 3D electromagnetic simulation software used to calculate the frequency targets above was also used to calculate the mode frequencies under small changes in $U_x$, $U_y$, and $U_z$. The results are shown in the following table.

|  | Target Values | Vary Ux | Vary Uy | Vary Uz |
| --- | --- | --- | --- | --- |
| Ux (mm) | 0.924 | 0.934 | 0.924 | 0.924 |
| Uy (mm) | 0.500 | 0.500 | 0.510 | 0.500 |
| Uz (mm) | 18.646 | 18.646 | 18.646 | 18.656 |
| ΔUx | 0 | 0.01 | 0 | 0 |
| ΔUy | 0 | 0 | 0.01 | 0 |
| ΔUz | 0 | 0 | 0 | 0.01 |
| Fx (MHz) | 1819.6690 | 1819.5396 | 1819.9584 | 1819.2442 |
| Fy (MHz) | 1859.6118 | 1860.0134 | 1859.4984 | 1859.1953 |
| Fz (MHz) | 1839.9051 | 1840.2530 | 1840.1473 | 1839.8979 |
| ΔFx | 0 | −0.1293 | 0.2895 | −0.4247 |
| ΔFy | 0 | 0.4016 | −0.1134 | −0.4165 |
| ΔFz | 0 | 0.3479 | 0.2422 | −0.0071 |
| ΔFx/ΔUx |  | −12.93 |  |  |
| ΔFx/ΔUy |  |  | 28.95 |  |
| ΔFx/ΔUz |  |  |  | −42.47 |
| ΔFy/ΔUx |  | 40.16 |  |  |
| ΔFy/ΔUy |  |  | −11.34 |  |
| ΔFy/ΔUz |  |  |  | −41.65 |
| ΔFz/ΔUx |  | 34.79 |  |  |
| ΔFz/ΔUy |  |  | 24.22 |  |
| ΔFz/ΔUz |  |  |  | −0.71 |

The resulting slope matrix in units of MHz/mm is thus:

$$M = \begin{bmatrix} -12.93 & 28.95 & -42.47 \\ 40.16 & -11.34 & -41.65 \\ 34.79 & 24.22 & -0.71 \end{bmatrix}_{MHz/mm}.$$

Inverting this and scaling to units of μm/MHz gives the tuning matrix calculated by the finite difference method:

$$M^{-1} = \begin{bmatrix} -9.05 & 8.97 & 15.02 \\ 12.64 & -13.23 & 19.98 \\ -12.17 & -11.75 & 9.04 \end{bmatrix}_{\mu m/MHz}.$$

To further extend the example, let us suppose that a component has been manufactured, and due to manufacturing variations in size and dielectric constant the measured frequencies of the X, Y and Z modes are 1816, 1855 and 1837 Mhz, respectively. These measured frequencies are denoted by:

$$F_m = \begin{bmatrix} 1816.000 \\ 1855.000 \\ 1837.000 \end{bmatrix}_{MHz}.$$

The target frequencies calculated above are subtracted from these measured frequencies to yield the following frequency errors:

$$\Delta F_e = F_m - F_t = \begin{bmatrix} -3.669 \\ -4.612 \\ -2.905 \end{bmatrix}_{MHz}.$$

By performing a matrix multiplication of this frequency error vector by the tuning matrix calculated above we obtain the vector of size changes relative to the design sizes corresponding to these frequency errors. To obtain the required size change to the actual resonator to correct this frequency error we negate the above to obtain the following expression for the required size correction:

$$\Delta S_a = -M^{-1}\Delta F_e = \begin{bmatrix} 51.8 \\ 43.4 \\ -72.6 \end{bmatrix}_{\mu m}.$$

Thus, in this example one X truncation needs to be deepened by 52 um, one Y truncation needs to be deepened by 43 um and the cylinder height needs to be decreased by 73 um. This would be achieved by performing the lapping process (described earlier) on each of the X and Y truncation surfaces and on the Z face, removing the amounts of material given above. Assuming that errors in the 3D electromagnetic model, the calculated matrix, the measurement and the lapping adjustment are not too large then the above operation should have brought all three of the resonant frequencies of the cuboid into agreement with the frequency targets, $F_t$. The part would then be tuned.

As in the case of the lapped cuboid above, if the combined errors are too large it may be prudent to split the tuning into multiple cycles.

Section 6: Worked Example—Drilled Cuboid

As a final illustration, consider a filter component comprising a metallized ceramic cuboid of dimensions 17.0 mm, 18.0 mm and 19.0 mm in the X, Y and Z dimensions, respectively, and with a dielectric constant of 45. Let the cuboid also have a keyhole measurement structure of the form and dimensions shown in FIG. 2 formed on one of the X faces. Finally, let there be four holes of 1.5 mm diameter and 1.5 mm depth drilled into the centers of each of the two Y faces and each of the two Z faces, and one hole of diameter 2 mm and depth 1.5 mm drilled into the X face opposite the measurement structure. FIG. 8 illustrates three holes 610-1, 610-2, and 610-3 on a Z face, a Y face, and an X face, respectively. There would be an additional two holes 610 on the Y and Z faces opposite the Y and Z faces that are shown in FIG. 8. These two additional holes 610 are not shown in this figure.

A 3D electromagnetic simulation of this component was performed to determine the mode frequencies in the presence of the measurement structure, and with all five holes drilled to a depth of 1.5 mm. The calculated frequencies are 1713.4368 MHz, 1767.2922 MHz and 1811.6280 MHz, for the X, Y and Z modes, respectively. The above three mode frequencies will be used as the target frequencies for the subsequent tuning operations, and are denoted by:

$$F_t = \begin{bmatrix} 1713.437 \\ 1767.292 \\ 1811.628 \end{bmatrix}_{MHz}.$$

The adjustment method to be employed in this example is the drilling method. The first adjustment consists of drilling one hole of 2.0 mm diameter and depth, $U_x$, in the X face opposite to the face on which the measurement structure is located. The second adjustment consists of drilling two holes of 1.5 mm diameter and with the same depth, $U_y$, one in each of the two Y faces. The third adjustment consists of drilling two holes of 1.5 mm diameter and with the same depth, $U_z$, one in each of the two Z faces.

Because there are no analytic equations to calculate the resonant frequencies of a cuboid with holes drilled in the faces we must use the finite difference method to calculate the tuning matrix. Accordingly, the 3D electromagnetic simulation software used to calculate the frequency targets above was also used to calculate the mode frequencies under small changes in dimensions. The results are shown in the following table:

|  | Target Values | Vary Ux | VaryUy | Vary Uz |
|---|---|---|---|---|
| Ux (mm) | 1.5 | 2.0 | 1.5 | 1.5 |
| Uy (mm) | 1.5 | 1.5 | 2.0 | 1.5 |
| Uz (mm) | 1.5 | 1.5 | 1.5 | 2.0 |
| $\Delta Ux$ | 0 | 0.5 | 0 | 0 |
| $\Delta Uy$ | 0 | 0 | 0.5 | 0 |
| $\Delta Uz$ | 0 | 0 | 0 | 0.5 |
| Fx (MHz) | 1713.4368 | 1714.2782 | 1713.5767 | 1713.564 |
| Fy (MHz) | 1767.2922 | 1767.4291 | 1768.3055 | 1767.4220 |
| Fz (MHz) | 1811.6280 | 1811.7696 | 1811.7776 | 1812.6636 |
| $\Delta Fx$ | 0 | 0.8414 | 0.1400 | 0.1272 |
| $\Delta Fy$ | 0 | 0.1368 | 1.0133 | 0.1298 |
| $\Delta Fz$ | 0 | 0.1416 | 0.1497 | 1.0356 |
| $\Delta Fx/\Delta Ux$ |  | 1.6828 |  |  |
| $\Delta Fx/\Delta Uy$ |  |  | 0.2799 |  |
| $\Delta Fx/\Delta Uz$ |  |  |  | 0.2544 |
| $\Delta Fy/\Delta Ux$ |  | 0.2736 |  |  |
| $\Delta Fy/\Delta Uy$ |  |  | 2.0266 |  |
| $\Delta Fy/\Delta Uz$ |  |  |  | 0.2596 |
| $\Delta Fz/\Delta Ux$ |  | 0.2832 |  |  |
| $\Delta Fz/\Delta Uy$ |  |  | 0.2993 |  |
| $\Delta Fz/\Delta Uz$ |  |  |  | 2.0712 |

The resulting slope matrix in units of MHz/mm is thus:

$$M = \begin{bmatrix} 1.683 & 0.280 & 0.254 \\ 0.274 & 2.027 & 0.260 \\ 0.283 & 0.299 & 2.071 \end{bmatrix}_{MHz/mm}.$$

Inverting this and scaling to units of μm/MHz gives the tuning matrix calculated by the finite difference method:

$$M^{-1} = \begin{bmatrix} 618 & -76 & -66 \\ -74 & 512 & -55 \\ -74 & -64 & 500 \end{bmatrix}_{\mu m/MHz}.$$

To further extend the example, let us suppose that a component has been manufactured, and due to manufacturing variations in size and dielectric constant the measured frequencies of the X, Y and Z modes are 1712.492, 1765.180 and 1809.976 Mhz, respectively. These measured frequencies are denoted by:

$$F_m = \begin{bmatrix} 1712.492 \\ 1765.180 \\ 1809.976 \end{bmatrix} \text{MHz}.$$

The target frequencies calculated above are subtracted from these measured frequencies to yield the following frequency errors:

$$\Delta F_e = F_m - F_t \begin{bmatrix} -0.945 \\ -2.112 \\ -1.652 \end{bmatrix} \text{MHz}.$$

By performing a matrix multiplication of this frequency error vector by the tuning matrix calculated above we obtain the vector of hole depth changes relative to the design depths corresponding to these frequency errors. To obtain the depth change to the actual resonator holes required to correct this frequency error we negate the above to obtain the following expression for the required hole depth corrections:

$$\Delta U_a = -M^{-1} \Delta F_e = \begin{bmatrix} 314 \\ 921 \\ 621 \end{bmatrix} \mu m. \quad \text{Equation (5)}$$

Thus, in this example the depth of the X face hole needs to be increased by 314 μm, the depths of both of the holes on the Y faces need to be increased by 921 μm and the depths of both holes on the Z face need to be increased by 621 μm. Assuming that errors in the 3D electromagnetic model, the calculated matrix, the linearity between hole depth and frequency change, the measurement, and the drilling adjustment are not too large then the above operation should have brought all three of the resonant frequencies of the cuboid into agreement with the frequency targets, $F_t$. The part would then be tuned. As in the case of the lapped cuboid above, if the combined errors are too large the tuning process may be split into multiple cycles. For this example, the departure from linearity between the hole depths and resultant frequency changes are large enough that splitting the tuning into multiple cycles may be necessary to avoid overshooting the target, as will be demonstrated below.

When the above changes to the depths of the holes are performed in full, the resulting measured frequencies are:

$$F_m = \begin{bmatrix} 1713.527 \\ 1767.290 \\ 1811.697 \end{bmatrix} \text{MHz}.$$

This yields the following frequency errors:

$$\Delta F_e = \begin{bmatrix} 0.090 \\ -0.002 \\ 0.069 \end{bmatrix} \text{MHz}.$$

If errors of this magnitude are acceptable and would result in a filter within specification then the above component could be considered tuned. However, if the frequency tolerance was less than this (say, 50 kHz), then the component would not yet be fully tuned. Further, note that two of the three frequency errors are positive, meaning that to fully tune the component it would be necessary to reduce their frequency. Such a reduction would require the hole depths to be decreased, which is not possible since drilling is not a reversible operation, so the component would need to be scrapped.

A way to avoid such an outcome is to perform the adjustment in a series of steps, as described in step 8f of FIG. 12. Instead of performing 100% of the adjustment calculated in Equation (5), we perform 50% so that the hole depth adjustments are:

$$\Delta U_{a,partial} = 0.5(-M^{-1} \Delta F_e) = \begin{bmatrix} 157 \\ 460 \\ 311 \end{bmatrix} \mu m.$$

The resulting measured frequencies are then:

$$F_m = \begin{bmatrix} 1712.960 \\ 1766.210 \\ 1810.800 \end{bmatrix} \text{MHz}.$$

This yields the following frequency errors:

$$\Delta F_e = \begin{bmatrix} -0.480 \\ -1.083 \\ -0.831 \end{bmatrix} \text{MHz}.$$

As above, we use the tuning equation to obtain the required hole depth corrections:

$$\Delta U_a = -M^{-1} \Delta F_e = \begin{bmatrix} 160 \\ 473 \\ 311 \end{bmatrix} \mu m.$$

Instead of performing 100% of this adjustment, we perform 70% so that the required hole depth adjustments are:

$$\Delta U_{a,partial} = 0.7(-M^{-1} \Delta F_e) = \begin{bmatrix} 112 \\ 331 \\ 218 \end{bmatrix} \mu m.$$

The resulting measured frequencies are then:

$$F_m = \begin{bmatrix} 1713.351 \\ 1766.991 \\ 1811.437 \end{bmatrix} \text{MHz}.$$

This yields the following frequency errors:

$$\Delta F_e = \begin{bmatrix} -0.085 \\ -0.301 \\ -0.191 \end{bmatrix} \text{MHz}.$$

As above, we use the tuning equation to obtain the following expression for the required hole depth correction:

$$\Delta U_G = -M^{-1} \Delta F_e = \begin{bmatrix} 17 \\ 137 \\ 70 \end{bmatrix} \mu m.$$

We perform 100% of this operation, and the resulting measured frequencies are:

$$F_m = \begin{bmatrix} 1713.477 \\ 1767.294 \\ 1811.652 \end{bmatrix} \text{MHz}.$$

This yields the following frequency errors:

$$\Delta F_e = \begin{bmatrix} 0.040 \\ 0.002 \\ 0.024 \end{bmatrix} \text{MHz}.$$

Assuming the required frequency tolerance to be 50 kHz, as discussed above, this component would now be considered tuned since the largest frequency error is 40 kHz. Note that the frequencies are all a little too high so that it would not be possible to lower them (because of the non-reversibility of drilling discussed above) to correct this small error. However, since they are within tolerance this does not matter.

Without in any way limiting the scope, interpretation, or application of the claims appearing below, a technical effect of one or more of the example embodiments disclosed herein allow multimode resonator blocks to be tuned with a minimum of steps. In the case of a triple mode resonator, three adjustments are made per tuning cycle. This saves time and lowers the cost of the resulting filters. If the tuning matrix method is not used, and the three adjustments are performed singly, then the steps taken would need to be very small to avoid overshooting on one frequency as a result of adjustments to the other. Thus, the cost of tuning could be greatly increased.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. A method, comprising:
calculating one or more target mode frequencies for a defined filter component used as a reference for filter components to be subsequently tuned, wherein the defined filter component has one or more resonant modes, each of which has a mode frequency which can be tuned to a corresponding target mode frequency via physical adjustment of one or more parameters associated with the defined filter component;
forming a tuning equation at least by linearly relating, via a slope matrix, changes in one or more mode frequencies to corresponding physical adjustment in the one or more parameters, and wherein the tuning equation relates physical adjustment in the one or more parameters to changes in the one or more mode frequencies adjusted by an inverse of the slope matrix; and
for a filter component to be tuned, performing a tuning procedure comprising:
determining, using at least the tuning equation, adjustment information for at least one of the one or more parameters of the filter component to be tuned to adjust each of one or more measured mode frequencies of the filter component to be tuned toward meeting a corresponding target mode frequency for a corresponding resonant mode within a corresponding tolerance; and
outputting the determined adjustment information for the at least one parameter to be used for physical adjustment of the at least one parameter.

2. The method of claim 1, wherein the tuning procedure further comprises:
performing the physical adjustment of the at least one parameter.

3. The method of claim 2, comprising performing the tuning procedure to physically adjust parameters of the filter component to be tuned until a tuned version of the filter component to be tuned has each one of a set of the one or more measured mode frequencies meeting the corresponding target mode frequency for the corresponding resonant mode within the corresponding tolerance.

4. The method of claim 3, further comprising assembling the tuned filter component into a filter and placing the filter in a device.

5. The method of claim 1, wherein:
at least one of the one or more parameters corresponds to physical adjustments that are reversible;
the defined filter component has a defined physical structure with the at least one parameter corresponding to these physical adjustments having design dimensions; and
the filter component to be tuned has been manufactured with the defined physical structure and the corresponding design dimensions.

6. The method of claim 5, wherein the defined physical structure comprises a parameter of a tuning screw, and wherein the tuning screw for the filter component to be tuned is partially inserted into the filter component to be tuned, and the partial insertion of the screw creates a design dimension for the insertion.

7. The method of claim 5, wherein:
the at least one of the one or more parameters is at least one first parameter;
the at least one first parameter corresponds to physical adjustments that are reversible;
at least one second parameter of the one or more parameters corresponds to physical adjustments that are not reversible;
the defined filter component has a defined physical structure with the at least one second parameter corresponding to these physical adjustments having design dimensions; and
the filter component to be tuned has been manufactured with the defined physical structure but with one or more dimensions that are modified from the corresponding design dimensions.

8. The method of claim 1, wherein:
at least one of the one or more parameters correspond to physical adjustments that are irreversible;
the defined filter component has a defined physical structure with the at least one parameter corresponding to these physical adjustments having design dimensions; and
the filter component to be tuned has been manufactured with the defined physical structure but with one or more dimensions that are modified from the corresponding design dimensions to cause adjustment that is opposite to adjustment which will occur during irreversible physical adjustment operations.

9. The method of claim 8, wherein the defined physical structure comprises a cube having parameters of six different faces, each set of faces being parallel along one of three different axes and having a design dimension of a distance between the set of faces, and wherein the filter component to be tuned has been manufactured with at least one dimension along a corresponding axis larger than a corresponding design dimension.

10. The method of claim 8, wherein the defined physical structure comprises a parameter of a hole having a design dimension, and wherein the filter component to be tuned has been manufactured with a dimension of the hole that is shallower than a hole with the design dimension.

11. The method of claim 8, wherein the defined physical structure comprises a parameter of a dented metal enclosure and wherein the filter component to be tuned has been manufactured with an un-dented metal enclosure.

12. The method of claim 1, wherein:
calculating further comprises calculating the one or more target mode frequencies of the defined filter component including a test structure attached; and
the method further comprises measuring the one or more measured mode frequencies using a test structure attached to the filter component to be tuned.

13. The method of claim 1, wherein:
determining the adjustment information comprises:
subtracting the one or more target mode frequencies from the one or more measured mode frequencies to obtain a vector of mode frequency errors;
calculating one or more physical adjustments in corresponding parameters required to tune the filter component to be tuned by multiplying the inverted slope matrix by the vector of mode frequency errors to create a result and negating the result; and outputting further comprises outputting the calculated one or more physical adjustments to be used for physical adjustment of the corresponding parameters.

14. The method of claim 13, wherein:
each of the corresponding parameter corresponds to one of a plurality of dimensions of the filter component to be tuned; and
the method further comprises physically modifying at least one of the dimensions of the filter component to be tuned, based on the calculated one or more physical adjustments that have been output.

15. The method of claim 14, wherein the filter component to be tuned comprises a cuboid bounded by six faces, each set of two sides being disposed along a different one of three directions and separated by one of the three dimensions, the cuboid comprising ceramic having an outer surface covered with a conductive coating, and wherein physically modifying at least one of the dimensions of the filter component to be tuned comprises removing part of the ceramic from at least one face of the cuboid by an amount that is less than or equal to a value of a corresponding one of the one or more calculated adjustments, and wherein the method further comprises reapplying the conductive coating to the at least one face where the ceramic was removed.

16. The method of claim 13, wherein:
the method further comprises selecting at least one of the dimensions of the filter component to be tuned, from one of the dimensions to all of the dimensions;
the method further comprises physically modifying the selected at least one of the dimension of the filter component to be tuned, based on the calculated one or more physical adjustments that have been output and that correspond to the selected at least one dimension, wherein the physically modifying is performed using all of an amount of the calculated one or more physical adjustments that have been output or is performed using less than all of the amount of the calculated one or more physical adjustments that have been output; and
performing the tuning procedure further comprises, after physically modifying the selected at least one of the dimension of the filter component to be tuned:
measuring the mode frequencies using a test structure attached to the filter component to be tuned;
comparing the target mode frequencies and the measured mode frequencies to determine whether each one of a set of the one or more measured mode frequencies meets a target mode frequency for a corresponding resonant mode within a corresponding tolerance.

17. The method of claim 16, wherein the physically modifying the selected at least one of the dimensions is performed using less than all of the amount of the calculated one or more physical adjustments that have been output.

18. The method of claim 16, wherein, in response to each one of the set of the one or more measured mode frequencies not meeting its target mode frequency for the corresponding resonant mode within the corresponding tolerance, performing the following again: determining adjustment information, outputting the determined adjustment information, selecting at least one of the dimensions of the filter component to be tuned, physically modifying the selected at least one of the dimensions of the filter component to be tuned, measuring the mode frequencies, and comparing the target mode frequencies and the measured mode frequencies.

19. The method of claim 16, performing, in response to each of the set of the one or more measured mode frequencies meeting a target mode frequency for the corresponding resonant mode within the corresponding tolerance, stopping the method and considering the filter component to be tuned as being tuned.

20. The method of claim 16, wherein comparing the target mode frequencies and the measured mode frequencies further comprises subtracting the target mode frequencies from the measured mode frequencies to obtain mode frequency errors and determining whether each of the mode frequency errors is within a corresponding tolerance.

21. The method of claim 1, wherein performing the tuning procedure comprises performing the tuning procedure using the tuning equation to physically adjust at least one of the one or more parameters of the filter component to be tuned until the tuned version of the filter component to be tuned has a single measured mode frequency meeting a corresponding target mode frequency for one resonant mode within a corresponding tolerance.

22. The method of claim 1, wherein performing the tuning procedure comprises performing the tuning procedure using the tuning equation to physically adjust at least one of the one or more parameters of the filter component to be tuned until the tuned version of the filter component to be tuned has multiple measured mode frequencies meeting corresponding multiple target mode frequencies for corresponding multiple resonant modes within corresponding multiple tolerances.

23. The method of claim 1, wherein:
both the defined filter component and the filter component to be tuned comprise a cuboid bounded by six faces, each set of two sides along a different one of three directions x, y, and z, the cuboid comprising ceramic having an outer surface covered with a conductive coating; and
the slope matrix is a matrix of partial derivatives and relates changes in mode frequencies $\Delta f_x$, $\Delta f_y$, and $\Delta f_z$ in the x, y, and z directions, respectively, to changes in adjustable parameters $\Delta S_x$, $\Delta S_y$, and $\Delta S_z$, which are changes in the x, y, and z directions, in the parameters of dimensions in three dimensions, based on the following equation:

$$\begin{pmatrix} \Delta f_x \\ \Delta f_y \\ \Delta f_z \end{pmatrix} = \begin{pmatrix} \frac{\partial f_x}{\partial S_x} & \frac{\partial f_x}{\partial S_y} & \frac{\partial f_x}{\partial S_z} \\ \frac{\partial f_y}{\partial S_x} & \frac{\partial f_y}{\partial S_y} & \frac{\partial f_y}{\partial S_z} \\ \frac{\partial f_z}{\partial S_x} & \frac{\partial f_z}{\partial S_y} & \frac{\partial f_z}{\partial S_z} \end{pmatrix} \begin{pmatrix} \Delta S_x \\ \Delta S_y \\ \Delta S_z \end{pmatrix},$$

wherein $$\begin{pmatrix} \frac{\partial f_x}{\partial S_x} & \frac{\partial f_x}{\partial S_y} & \frac{\partial f_x}{\partial S_z} \\ \frac{\partial f_y}{\partial S_x} & \frac{\partial f_y}{\partial S_y} & \frac{\partial f_y}{\partial S_z} \\ \frac{\partial f_z}{\partial S_x} & \frac{\partial f_z}{\partial S_y} & \frac{\partial f_z}{\partial S_z} \end{pmatrix}$$

is the slope matrix and $\partial f/\partial S$ is a partial derivative of mode frequency f with respect to the adjustable parameter S.

24. The method of claim 1, wherein:
both the defined filter component and the filter component to be tuned comprise a resonator with N resonant modes and a same number of physical adjustments;
the mode frequencies are denoted by the vector:

$$F = \begin{bmatrix} f_1 \\ f_3 \\ f_3 \\ \vdots \\ f_N \end{bmatrix};$$

the adjustments are quantified by the vector:

$$S = \begin{bmatrix} s_1 \\ s_3 \\ s_3 \\ \vdots \\ s_N \end{bmatrix};$$

a variation of frequencies with small adjustments is expressed by:

$\Delta F = M \Delta S;$ a vector of adjustment changes is denoted by:

$$\Delta S = \begin{bmatrix} \Delta s_1 \\ \Delta s_3 \\ \Delta s_3 \\ \vdots \\ \Delta s_N \end{bmatrix};$$

a vector of resultant frequency changes is denoted by:

$$\Delta F = \begin{bmatrix} \Delta f_1 \\ \Delta f_3 \\ \Delta f_3 \\ \vdots \\ \Delta f_N \end{bmatrix};$$

and
the slope matrix composed of partial derivatives of mode frequencies with respect to adjustment parameters is denoted by:

$$M = \begin{bmatrix} \frac{\partial f_1}{\partial s_1} & \frac{\partial f_1}{\partial s_2} & \frac{\partial f_1}{\partial s_3} & \cdots & \frac{\partial f_1}{\partial s_N} \\ \frac{\partial f_2}{\partial s_1} & \frac{\partial f_2}{\partial s_2} & \frac{\partial f_2}{\partial s_3} & \cdots & \frac{\partial f_2}{\partial s_N} \\ \frac{\partial f_3}{\partial s_1} & \frac{\partial f_3}{\partial s_2} & \frac{\partial f_3}{\partial s_3} & \cdots & \frac{\partial f_3}{\partial s_N} \\ \vdots & \vdots & \vdots & \ddots & \vdots \\ \frac{\partial f_N}{\partial s_1} & \frac{\partial f_N}{\partial s_2} & \frac{\partial f_N}{\partial s_3} & \cdots & \frac{\partial f_N}{\partial s_N} \end{bmatrix}.$$

25. The method of claim 1, wherein the slope matrix is a matrix of partial derivatives and linearly relates changes in the one or more mode frequencies to corresponding changes in the one or more parameters further comprises calculating using one or more analytic equations derivatives of the one or more mode frequencies with respect to the one or more parameters, wherein the one or more analytic equations relate mode frequencies to the one or more parameters, and wherein calculating derivatives comprises assigning numbers for analytic equations to determine the actual numerical values for the derivatives.

26. The method of claim 1, wherein the slope matrix is a matrix of partial derivatives and linearly relates changes in the one or more mode frequencies to corresponding changes in the one or more parameters, and the method further comprises:

changing each adjustment in a parameter a small amount in turn, then for each adjustment calculate new mode frequencies;

subtracting target mode frequencies from the new mode frequencies to determine frequency changes resulting from the adjustments;

dividing these changes by the dimension of the adjustments in parameters used previously to derive a finite difference approximation to the derivatives of mode frequencies with respect to the adjustment parameters; and composing the derivatives into the slope matrix.

27. A method, comprising:

performing a tuning procedure using a tuning equation, wherein the tuning equation has been previously formed and linearly relates, via a slope matrix, changes in one or more mode frequencies for a defined filter component to corresponding physical adjustment in one or more parameters of the defined filter component, wherein each of one or more resonant modes of the defined filter component can be tuned to a corresponding target mode frequency via physical adjustment of the one or more parameters, wherein the tuning equation relates physical adjustment in the one or more parameters to changes in the one or more mode frequencies adjusted by an inverse of the slope matrix, and where performing the tuning procedure comprises:

physically adjusting at least one of the one or more parameters of a filter component to be tuned until a tuned version of the filter component to be tuned has each of a set of one or more measured mode frequencies meeting a corresponding target frequency for a corresponding resonant mode within a corresponding tolerance.

* * * * *